United States Patent
Ko et al.

(10) Patent No.: US 10,840,357 B2
(45) Date of Patent: Nov. 17, 2020

(54) FINFET DEVICE AND METHOD OF FORMING SAME

(71) Applicant: Taiwan Semiconductor Manufacturing Company, Ltd., Hsinchu (TW)

(72) Inventors: Chung-Ting Ko, Kaohsiung (TW); Bo-Cyuan Lu, New Taipei (TW); Jr-Hung Li, Chupei (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/593,209

(22) Filed: Oct. 4, 2019

(65) Prior Publication Data

US 2020/0035814 A1    Jan. 30, 2020

Related U.S. Application Data

(63) Continuation of application No. 15/907,633, filed on Feb. 28, 2018, now Pat. No. 10,505,021.

(Continued)

(51) Int. Cl.
*H01L 29/66* (2006.01)
*H01L 21/762* (2006.01)
(Continued)

(52) U.S. Cl.
CPC .... *H01L 29/66795* (2013.01); *H01L 21/0214* (2013.01); *H01L 21/0217* (2013.01); *H01L 21/0228* (2013.01); *H01L 21/02126* (2013.01); *H01L 21/02167* (2013.01); *H01L 21/02178* (2013.01); *H01L 21/02271* (2013.01); *H01L 21/3081* (2013.01); *H01L 21/3086* (2013.01); *H01L 21/32* (2013.01); *H01L 21/76224* (2013.01); *H01L 21/823821* (2013.01); *H01L 29/66545* (2013.01); *H01L 29/66636* (2013.01);

(Continued)

(58) Field of Classification Search
CPC .............. H01L 51/5004; H01L 51/0035; H01L 51/0097; H01L 2251/5376; C01K 11/87; C01K 2211/185

See application file for complete search history.

(56) References Cited

U.S. PATENT DOCUMENTS 8,962,400 B2  2/2015  Tsai et al.
9,093,514 B2  7/2015  Tsai et al.
(Continued)

FOREIGN PATENT DOCUMENTS

KR    20160122475 A    10/2016
TW     201712863 A     4/2017
TW     201731107 A     9/2017

*Primary Examiner* — Zandra V Smith
*Assistant Examiner* — Andre C Stevenson
(74) *Attorney, Agent, or Firm* — Slater Matsil, LLP

(57) ABSTRACT

A FinFET device and a method of forming the same are provided. A method includes forming a fin extending above an isolation region. A sacrificial gate is formed over the fin. A first dielectric material is selectively deposited on sidewalls of the sacrificial gate to form spacers on the sidewalls of the sacrificial gate. The fin is patterned using the sacrificial gate and the spacers as a combined mask to form a recess in the fin. An epitaxial source/drain region is formed in the recess.

20 Claims, 56 Drawing Sheets

Related U.S. Application Data

(60) Provisional application No. 62/565,794, filed on Sep. 29, 2017.

(51) Int. Cl.
   *H01L 21/308*    (2006.01)
   *H01L 21/02*     (2006.01)
   *H01L 21/8238*   (2006.01)
   *H01L 29/78*     (2006.01)
   *H01L 21/32*     (2006.01)
   *H01L 21/3115*   (2006.01)

(52) U.S. Cl.
   CPC ...... *H01L 29/7848* (2013.01); *H01L 21/0234* (2013.01); *H01L 21/02321* (2013.01); *H01L 21/3115* (2013.01)

(56) References Cited

U.S. PATENT DOCUMENTS

| | | | |
|---|---|---|---|
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,812,363 B1 | 11/2017 | Liao et al. | |
| 9,859,380 B2 | 1/2018 | Lee et al. | |
| 2005/0156171 A1* | 7/2005 | Brask | H01L 27/0924 |
| | | | 257/72 |
| 2014/0147999 A1 | 5/2014 | Zhou | |
| 2016/0293668 A1* | 10/2016 | Cao | H01L 51/0558 |
| 2016/0307927 A1 | 10/2016 | Lee et al. | |
| 2017/0077097 A1 | 3/2017 | Dong et al. | |
| 2017/0221771 A1* | 8/2017 | You | H01L 29/0653 |
| 2017/0243868 A1 | 8/2017 | Lee et al. | |
| 2018/0261512 A1 | 9/2018 | Greene et al. | |

\* cited by examiner

FINFET DEVICE AND METHOD OF FORMING SAME

PRIORITY CLAIM AND CROSS-REFERENCE

This application is a continuation of U.S. application Ser. No. 15/907,633, filed on Feb. 28, 2018, entitled "FinFET Device and Method of Forming Same," which claims the benefit of U.S. Provisional Application No. 62/565,794, filed on Sep. 29, 2017, entitled "FinFET Device and Method of Forming Same," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-5A are cross-sectional views of intermediate stages in the manufacture of a FinFET device in accordance with some embodiments.

DETAILED DESCRIPTION

Figure 1:
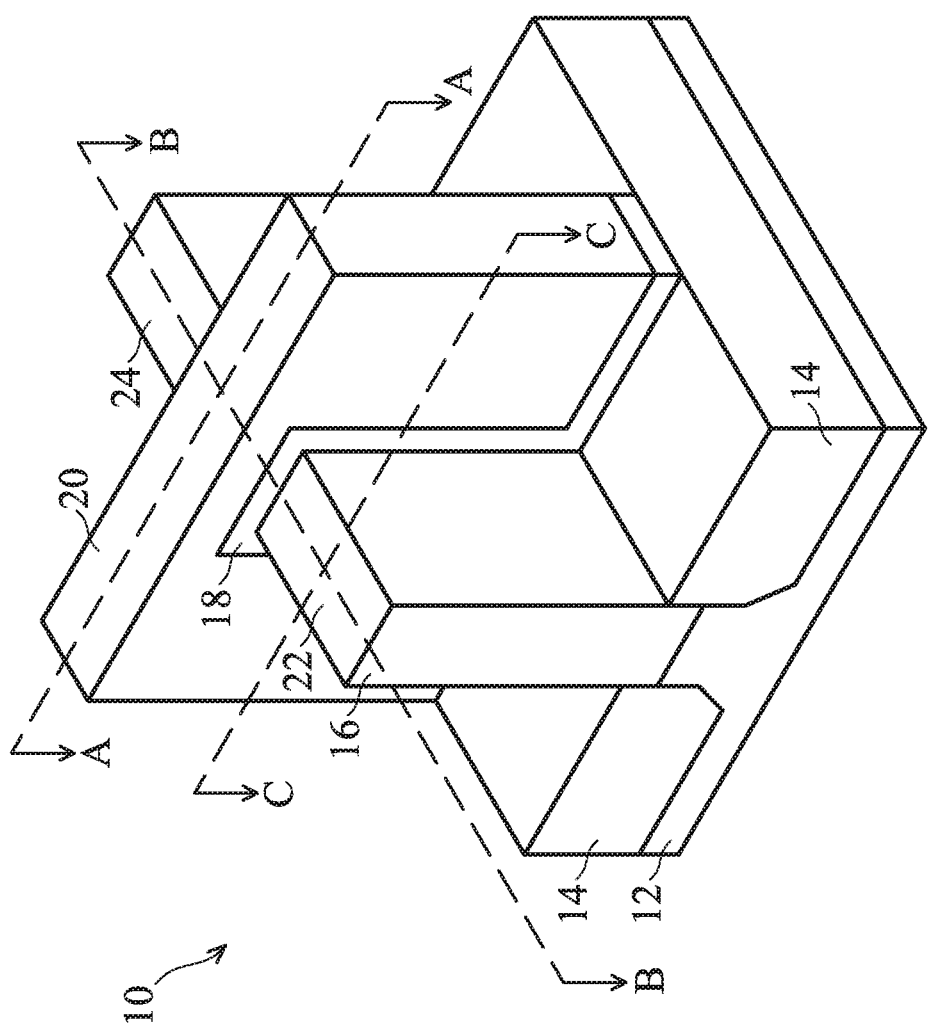
FIG. 1 is a perspective view of a fin field-effect transistor ("FinFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a FinFET device and a method of forming the same. Various embodiments presented herein are discussed in the context of a FinFET device formed using a gate-last process. In other embodiments, a gate-first process may be used. Also, some embodiments contemplate aspects used in planar devices, such as planar FET devices. Various embodiments discussed herein allow for selectively forming gate spacers on sidewalls of gates, forming well-defined nucleation areas for epitaxial source/drain regions, forming uniform epitaxial source/drain regions, enlarging process window, precise process control, and easy process integration.

FIG. 1 illustrates an example of a fin field-effect transistor (FinFET) 10 in a three-dimensional view. The FinFET 10 comprises a fin 16 on a substrate 12. The substrate 12 includes isolation regions 14, and the fin 16 protrudes above and from between neighboring isolation regions 14. A gate dielectric 18 is along sidewalls and over a top surface of the fin 16, and a gate electrode 20 is over the gate dielectric 18. Source/drain regions 22 and 24 are disposed in opposite sides of the fin 16 with respect to the gate dielectric 18 and gate electrode 20. The FinFET 10 illustrated in FIG. 1 is provided for illustrative purposes only and is not meant to limit the scope of the present disclosure. As such, many variations are possible, such as epitaxial source/drain regions, multiple fins, multilayer fins, etc.

FIGS. 2A through 22A-22C are cross-sectional views of intermediate stages in the manufacturing of a FinFET device in accordance with some embodiments. In FIGS. 2A through 22A-22C, figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1.

Figure 2A:
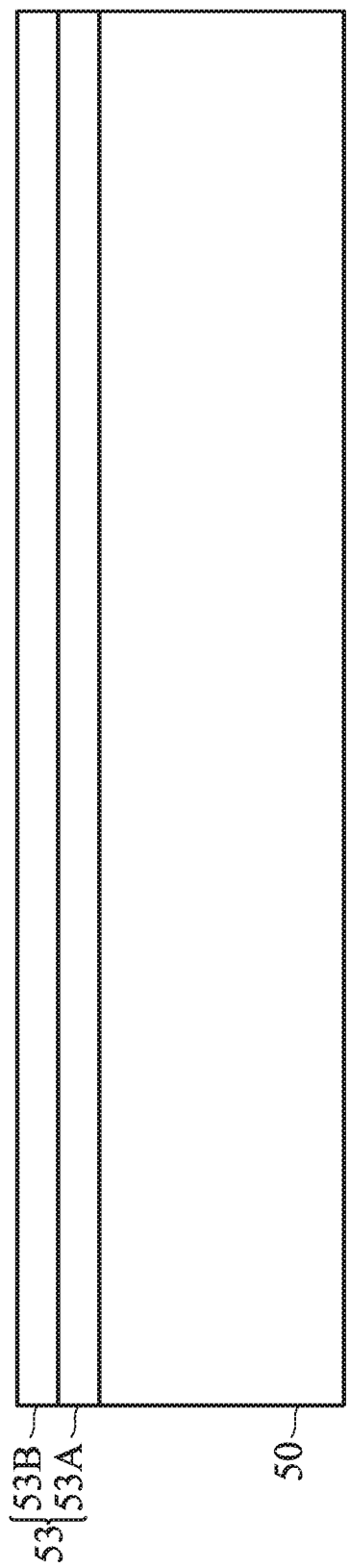

FIG. 2A illustrates a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof; or the like.

The substrate 50 may further include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the resulting FinFET device. The integrated circuit devices may be formed using any suitable methods.

In some embodiments, appropriate wells (not shown) may be formed in the substrate 50. In some embodiments where the resulting FinFET device is an n-type device, the wells are p-wells. In some embodiments where the resulting FinFET device is a p-type device, the wells are n-wells. In other embodiments, both p-wells and n-wells are formed in the substrate 50. In some embodiments, p-type impurities are implanted into the substrate 50 to form the p-wells. The p-type impurities may be boron, $BF_2$, or the like, and may be implanted to a concentration of equal to or less than $10^{18}$ $cm^{-3}$, such as in a range from about $10^{17}$ $cm^{-3}$ to about $10^{18}$ $cm^{-3}$. In some embodiments, n-type impurities are implanted into the substrate 50 to form the n-wells. The n-type impurities may be phosphorus, arsenic, or the like, and may be implanted to a concentration of equal to or less than $10^{18}$ $cm^{-3}$, such as in a range from about $10^{17}$ $cm^{-3}$ to about $10^{18}$ $cm^{-3}$. After implanting the appropriate impurities, an anneal may be performed on the substrate to activate the p-type and n-type impurities that were implanted.

FIG. 2A further illustrates the formation of a mask 53 over the substrate 50. In some embodiments, the mask 53 may be used in a subsequent etching step to pattern the substrate 50 (see FIG. 3A). In some embodiments, the mask 53 may comprise one or more mask layers. As shown in FIG. 2A, in some embodiments, the mask 53 may include a first mask layer 53A and a second mask layer 53B over the first mask layer 53A. The first mask layer 53A may be a hard mask layer, may comprise silicon oxide, silicon nitride, silicon oxynitride, silicon carbide, silicon carbonitride, a combination thereof, or the like, and may be formed using any suitable process, such as thermal oxidation, thermal nitridation, atomic layer deposition (ALD), physical vapor deposition (PVD), chemical vapor deposition (CVD), a combination thereof, or the like. The first mask layer 53A may be used to prevent or minimize etching of the substrate 50 underlying the first mask layer 53A in the subsequent etch step (see FIG. 3A). The second mask layer 53B may comprise photoresist, and in some embodiments, may be used to pattern the first mask layer 53A for use in the subsequent etching step. The second mask layer 53B may be formed by using a spin-on technique and may be patterned using acceptable photolithography techniques. In some embodiments, the mask 53 may comprise three or more mask layers.

Figure 3A:
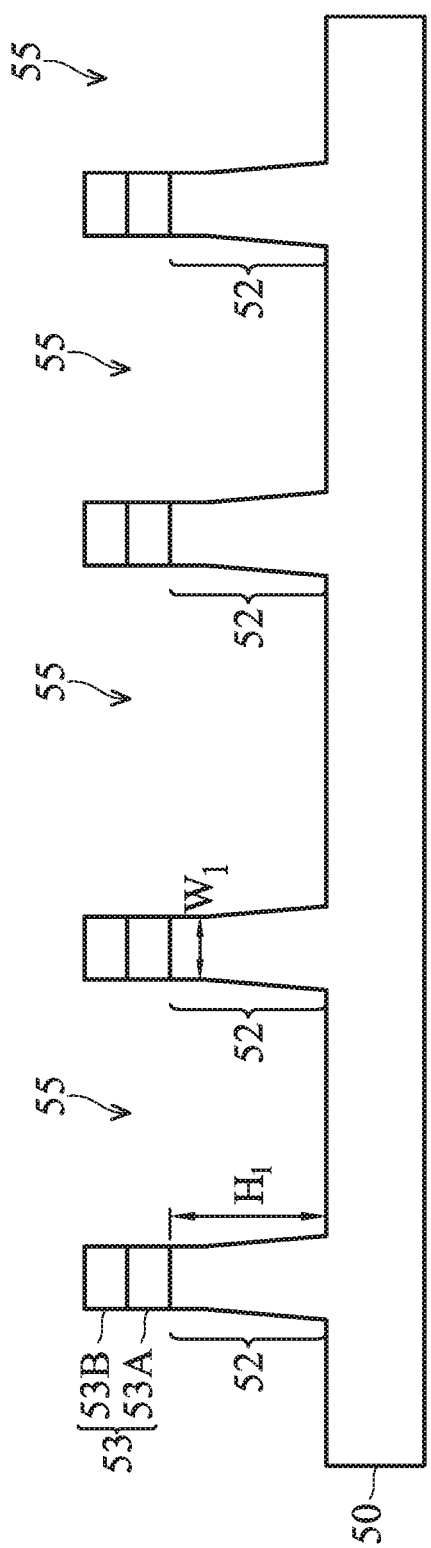

FIG. 3A illustrates the formation of semiconductor strips 52 in the substrate 50. First, mask layers 53A and 53B may be patterned, where openings in mask layers 53A and 53B expose areas of the substrate 50 where trenches 55 will be formed. Next, an etching process may be performed, where the etching process creates the trenches 55 in the substrate 50 through the openings in the mask 53. The remaining portions of the substrate 50 underlying a patterned mask 53 form a plurality of semiconductor strips 52. The etching may be any acceptable etch process, such as a reactive ion etch (RIE), neutral beam etch (NBE), a combination thereof, or the like. The etch process may be anisotropic. In some embodiments, after forming the semiconductor strips 52, any remaining portions of the mask 53 may be removed by any suitable process. In other embodiments, portions of the mask 53, such as the first mask layer 53A, may remain over the semiconductor strips 52. In some embodiments, the semiconductor strips 52 may have a height $H_1$ between about 70 nm and about 95 nm, and a width $W_1$ between about 10 nm and about 25 nm.

Figure 4A:
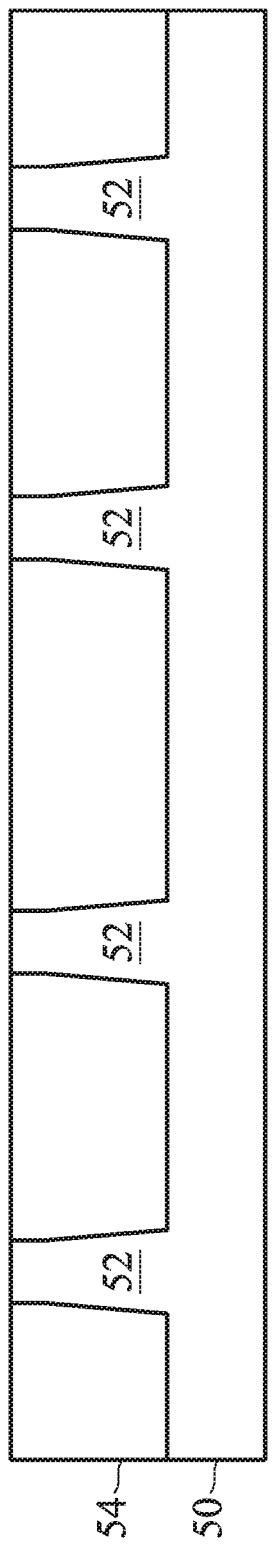

FIG. 4A illustrates the formation of an insulation material in the trenches 55 (see FIG. 3A) between neighboring semiconductor strips 52 to form isolation regions 54. The insulation material may be an oxide, such as silicon oxide, a nitride, such as silicon nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), a combination thereof, or the like. Other insulation materials formed by any acceptable processes may be also used.

Furthermore, in some embodiments, the isolation regions 54 may include a conformal liner (not illustrated) formed on sidewalls and bottom surfaces of the trenches 55 (see FIG. 3A) prior to filling the trenches 55 with an insulation material of the isolation regions 54. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, a polymer, combinations thereof, or the like. The formation of the liner may include any suitable method, such as ALD, CVD, HDP-CVD, PVD, a combination thereof, or the like. In such embodiments, the liner may prevent (or at least reduce) the diffusion of the semiconductor material from the semiconductor strips 52 (e.g., Si and/or Ge) into the surrounding isolation regions 54 during the subsequent annealing of the isolation regions 54. In some embodiments, after the insulation material of the isolation regions 54 are deposited, an annealing process may be performed on the insulation material of the isolation regions 54.

Referring further to FIG. 4A, a planarization process, such as a chemical mechanical polishing (CMP), may remove any excess insulation material of the isolation regions 54, such that top surfaces of the isolation regions 54 and top surfaces of the semiconductor strips 52 are coplanar. In some embodiments where portions of the mask 53 remain over the semiconductor strips 52 after forming the semiconductor strips 52, the planarization process may also remove the remaining portions of the mask 53.

Figure 5A:
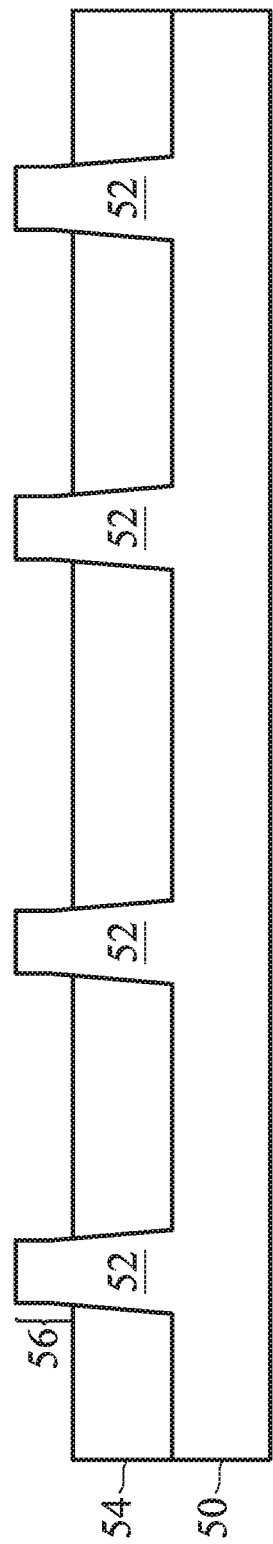

FIG. 5A illustrates the recessing of the isolation regions 54 to form Shallow Trench Isolation (STI) regions 54. The isolation regions 54 are recessed such that fins 56 protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch, an Applied Materials SICONI tool, or dilute hydrofluoric (dHF) acid may be used.

A person having ordinary skill in the art will readily understand that the process described with respect to FIGS. 2A through 5A is just one example of how the fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In yet other embodiments, heteroepitaxial structures can be used for the fins. For example, the semiconductor strips 52 in FIG. 4A can be recessed, and one or more materials different from the semiconductor strips 52 may be epitaxially grown in their place. In even further embodiments, a dielectric layer can be formed over a top surface of the substrate 50; trenches can be etched through the dielectric layer; heteroepitaxial structures can be epitaxially grown in the trenches using one or more materials different from the substrate 50; and the dielectric layer can be recessed such that the heteroepitaxial structures protrude from the dielectric layer to form fins 56.

In some embodiments where homoepitaxial or heteroepitaxial structures are epitaxially grown, the grown materials may be in situ doped during growth. In other embodiments, homoepitaxial or heteroepitaxial structures may be doped using, for example, ion implantation after homoepitaxial or heteroepitaxial structures are epitaxially grown. In various embodiments, the fins 56 may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6A:
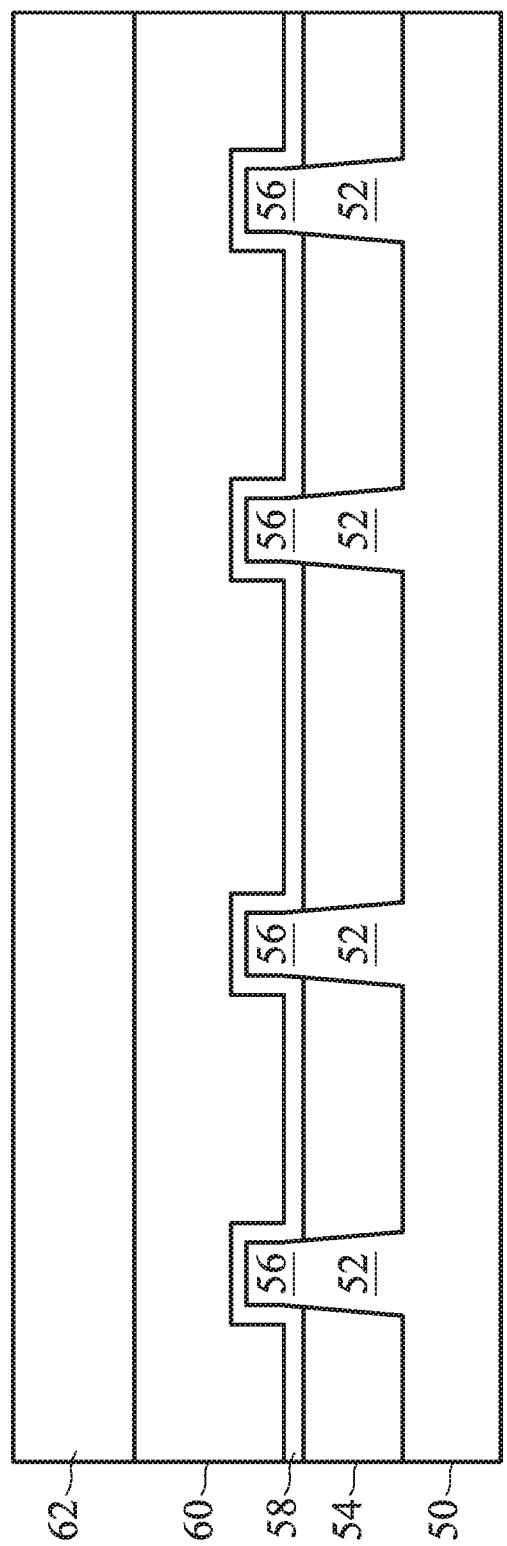
FIGS. 6A and 6B are cross-sectional views of intermediate stages in the manufacture of a FinFET device in accordance with some embodiments.
Figure 6B:
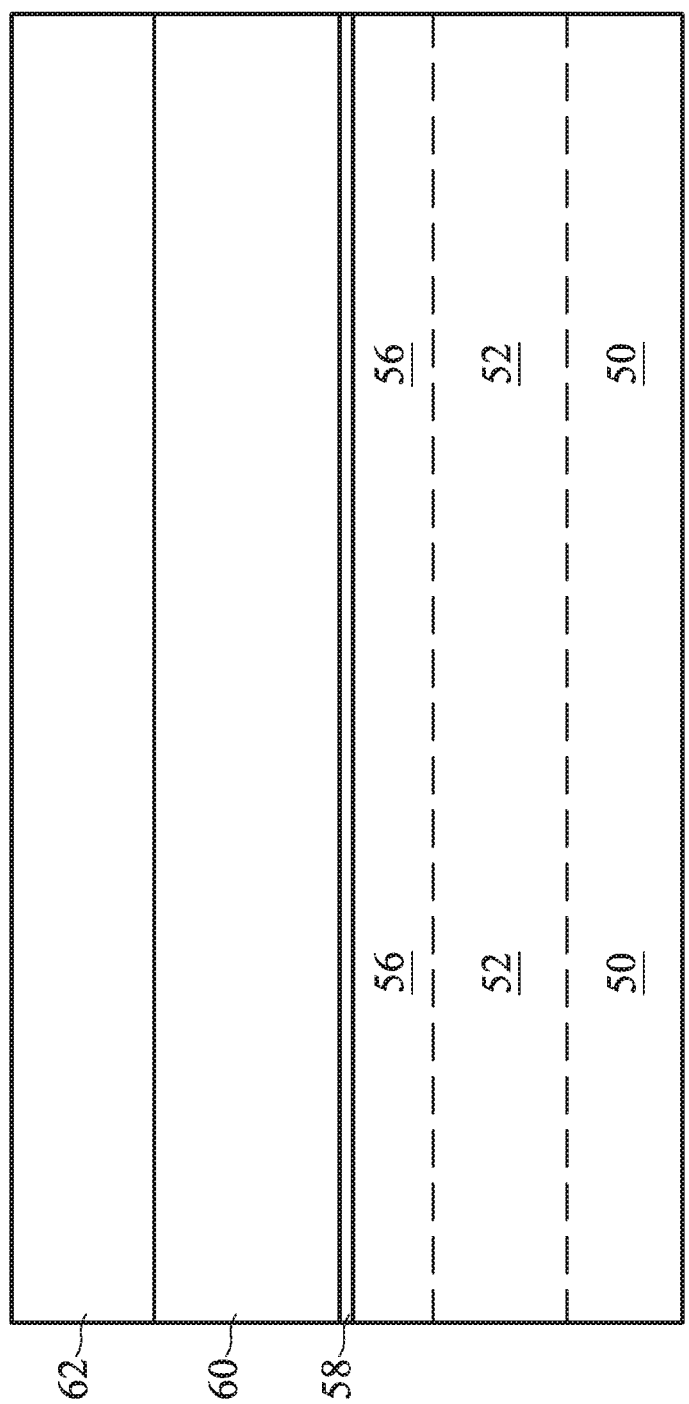

Referring to FIGS. 6A and 6B, a dielectric layer 58 is formed on sidewalls and top surfaces of the fins 56. In some embodiments, the dielectric layer 58 may be also formed over the isolation regions 54. In other embodiments, top surfaces of the isolation regions 54 may be free from the dielectric layer 58. The dielectric layer 58 may comprise an oxide, such as silicon oxide, or the like, and may be deposited (using, for example, ALD, CVD, PVD, a combination thereof, or the like) or thermally grown (for example, using thermal oxidation, or the like) according to acceptable techniques. In some embodiments, the dielectric layer 58 may comprise a dielectric material that has an acceptable breakdown voltage and leakage performance. A gate electrode layer 60 is formed over the dielectric layer 58, and a mask 62 is formed over the gate electrode layer 60. In some embodiments, the gate electrode layer 60 may be deposited over the dielectric layer 58 and then planarized using, for example, a CMP process. The mask 62 may be deposited over the gate electrode layer 60. The gate electrode layer 60 may be made of, for example, polysilicon, although other materials that have a high etching selectivity with respect to the material of the isolation regions 54 may also be used. The mask 62 may include one or more layers of, for example, silicon oxide, silicon nitride, silicon oxynitride, silicon carbide, silicon carbonitride, a combination thereof, or the like, and may be formed using any suitable process, such as thermal oxidation, thermal nitridation, ALD, PVD, CVD, a combination thereof, or the like. In the illustrated embodiment, the mask 62 comprises an oxide material, such as silicon oxide. In some embodiments, the mask 62 may have a thickness between about 20 nm and about 70 nm.

Figure 7A:
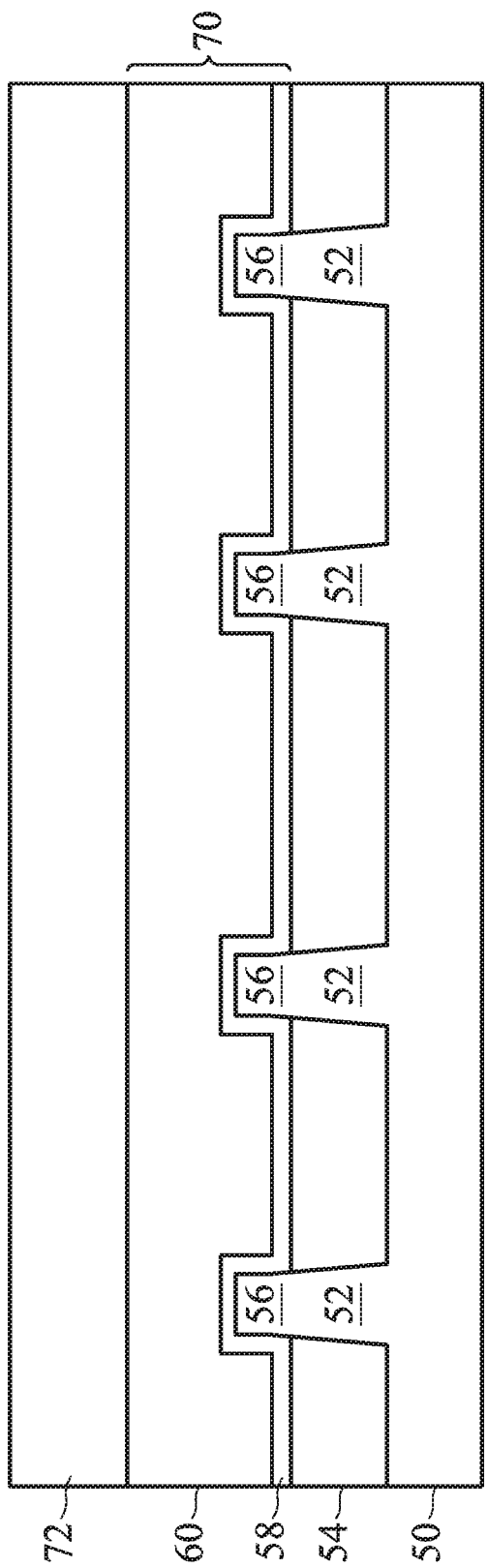
FIGS. 7A, 7B and 7C are cross-sectional views of intermediate stages in the manufacture of a FinFET device in accordance with some embodiments.
Figure 7B:
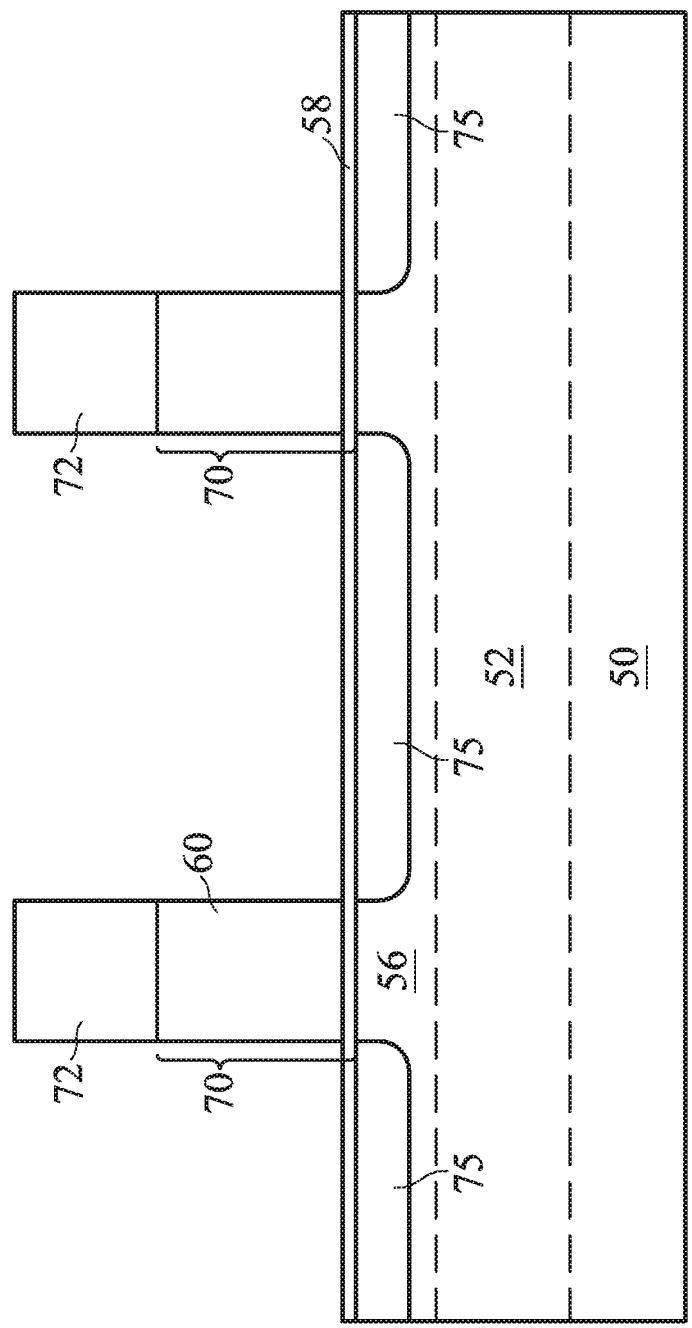
Figure 7C:
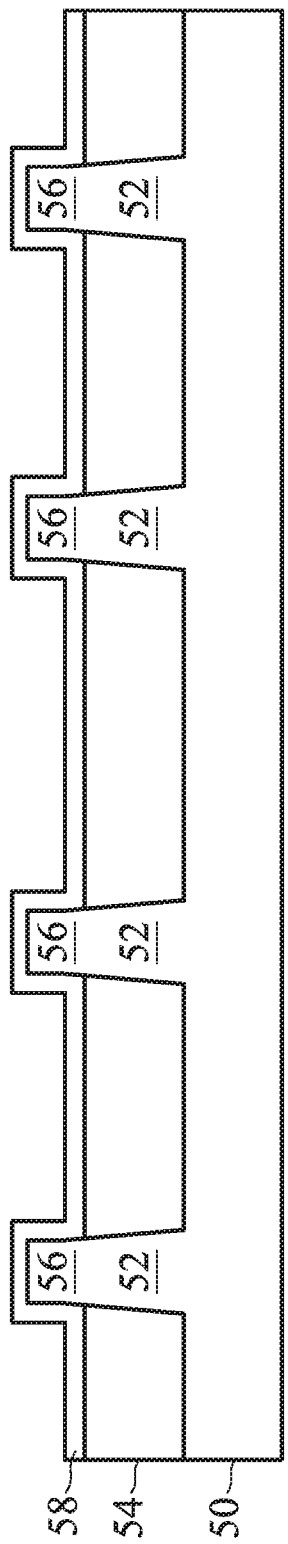

Referring to FIGS. 7A, 7B, and 7C, the mask 62 (see FIGS. 6A and 6B) may be patterned using acceptable photolithography and etching techniques to form a patterned mask 72. The pattern of the patterned mask 72 is transferred to the gate electrode layer 60 by an acceptable etching technique to form gates 70. The pattern of the gates 70 cover respective channel regions of the fins 56 while exposing source/drain regions of the fins 56. The gates 70 may also have a lengthwise direction substantially perpendicular to the lengthwise direction of respective fins 56, within process variations. A size of the gates 70, and a pitch between the gates 70, may depend on a region of a die in which the gates 70 are formed. In some embodiments, the gates 70 may have a larger size and a larger pitch when located in, for example, an input/output region of a die (e.g., where input/output circuitry is disposed) than when located in, for example, a logic region of a die (e.g., where logic circuitry is disposed). As described below in greater detail, the gates 70 are sacrificial gates and are subsequently replaced by replacement gates. Accordingly, the gates 70 may also be referred to as sacrificial gates 70.

Referring further to FIGS. 7A, 7B, and 7C, lightly doped source/drain (LDD) regions 75 may be formed in the substrate 50. Similar to the implantation process discussed above with reference to FIG. 2A, appropriate impurities are implanted into the fins 56 to form the LDD regions 75. In some embodiments where the resulting FinFET device is a p-type device, p-type impurities are implanted into the fins 56 to form p-type LDD regions 75. In some embodiments where the resulting FinFET device is an n-type device, n-type impurities are implanted into the fins 56 to form n-type LDD regions 75. During the implantation of the LDD regions 75, the gates 70 and the patterned mask 72 may act as a mask to prevent (or at least reduce) dopants from implanting into channel regions of the exposed fins 56. Thus, the LDD regions 75 may be formed substantially in source/drain regions of the exposed fins 56. The n-type impurities may be any of the n-type impurities previously discussed, and the p-type impurities may be any of the p-type impurities previously discussed. The LDD regions 75 may have a concentration of impurities between about $10^{15}$ cm$^{-3}$ to about $10^{16}$ cm$^{-3}$. After the implantation process, an annealing process may be performed to activate the implanted impurities.

Figure 8A:
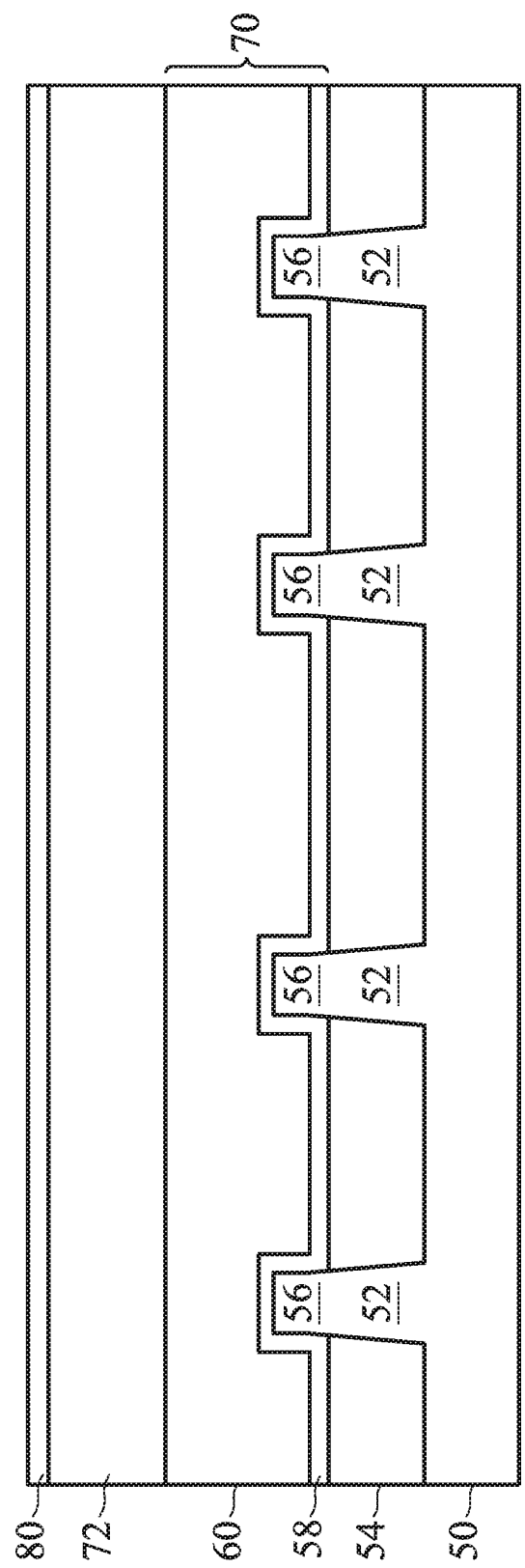
FIGS. 8A, 8B and 8C are cross-sectional views of intermediate stages in the manufacture of a FinFET device in accordance with some embodiments.
Figure 8B:
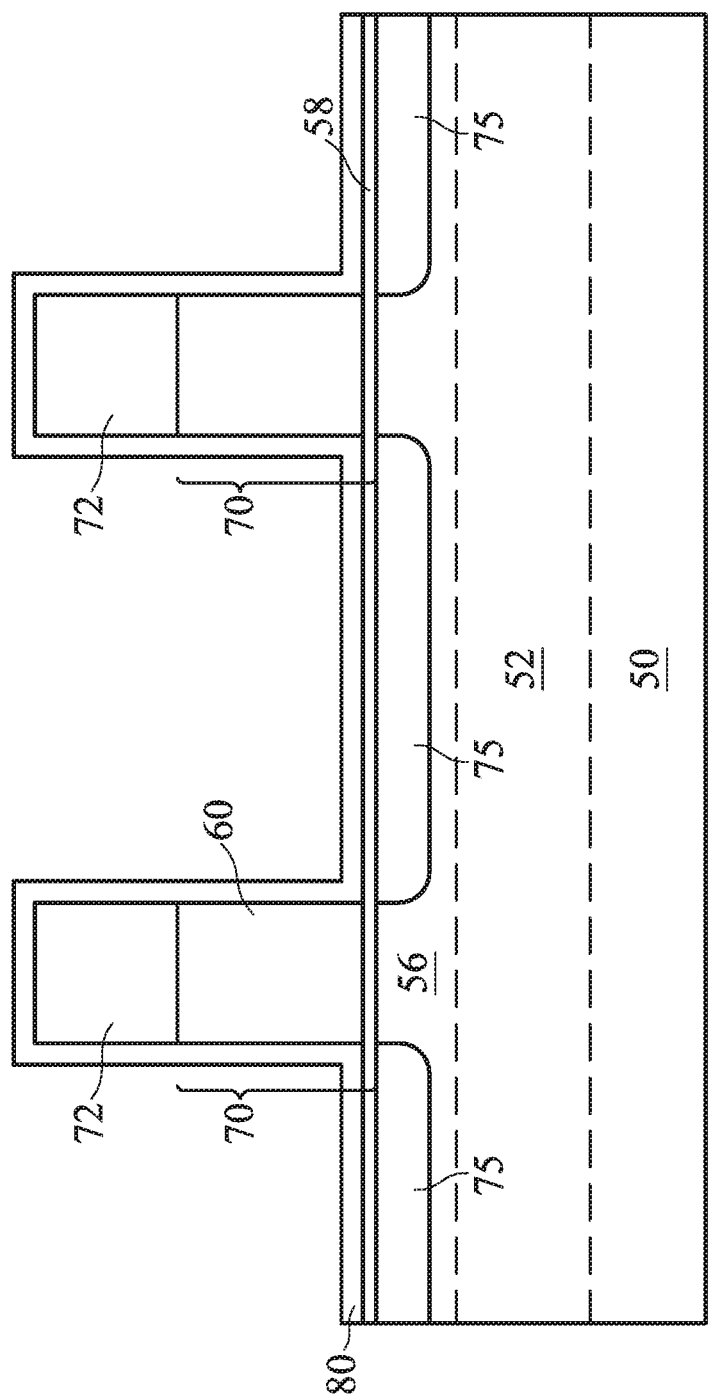
Figure 8C:
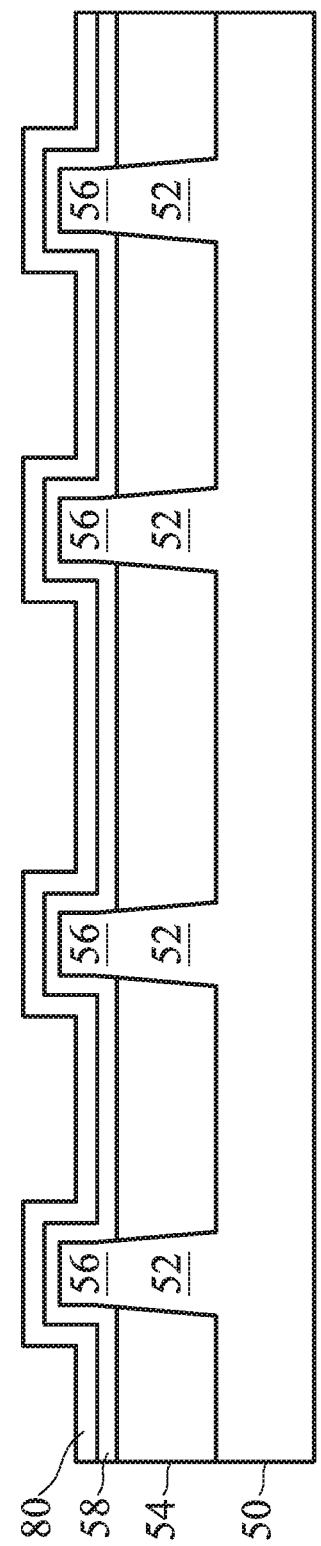

FIGS. 8A-11C illustrate the formation of spacers 82 on sidewalls of the gates 70 in accordance with some embodiments. Referring first to FIGS. 8A, 8B, and 8C, a dielectric layer 80 is formed on exposed surfaces of the sacrificial gates 70, the patterned mask 72, and the dielectric layer 58. In some embodiment, the dielectric layer 80 may comprises an oxide, such as aluminum oxide ($Al_2O_3$), or the like, and may be blanket deposited using CVD, ALD, or the like. In some embodiments where the dielectric layer 80 comprises aluminum oxide ($Al_2O_3$), the dielectric layer 80 may be formed using a precursor comprising a mixture of trimethylaluminum (TMA) and $H_2O$, a mixture of trimethylaluminum (TMA) and $O_3/O_2$, or the like. In some embodiments, the dielectric layer 80 may be formed at a pressure between about 0.5 Torr and about 10 Torr and at a temperature between about 25° C. and about 350° C. In some embodiments, the dielectric layer 80 may have a thickness between about 1 nm and about 6 nm.

Figure 9A:
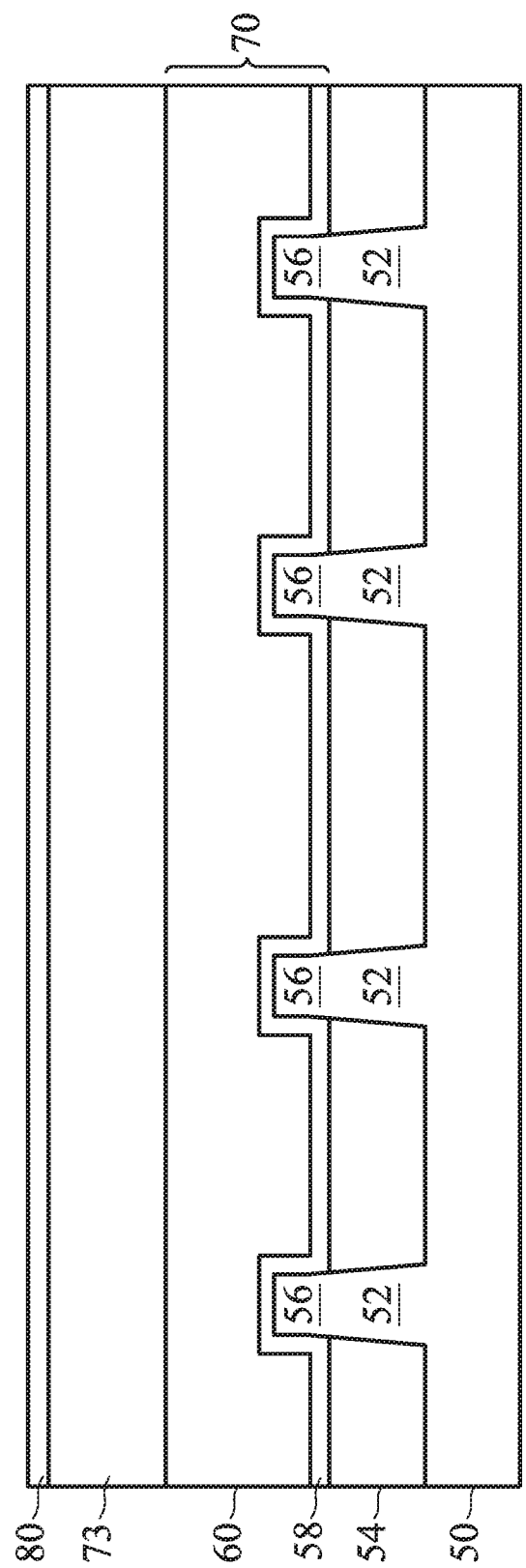
FIGS. 9A, 9B and 9C are cross-sectional views of intermediate stages in the manufacture of a FinFET device in accordance with some embodiments.
Figure 9B:
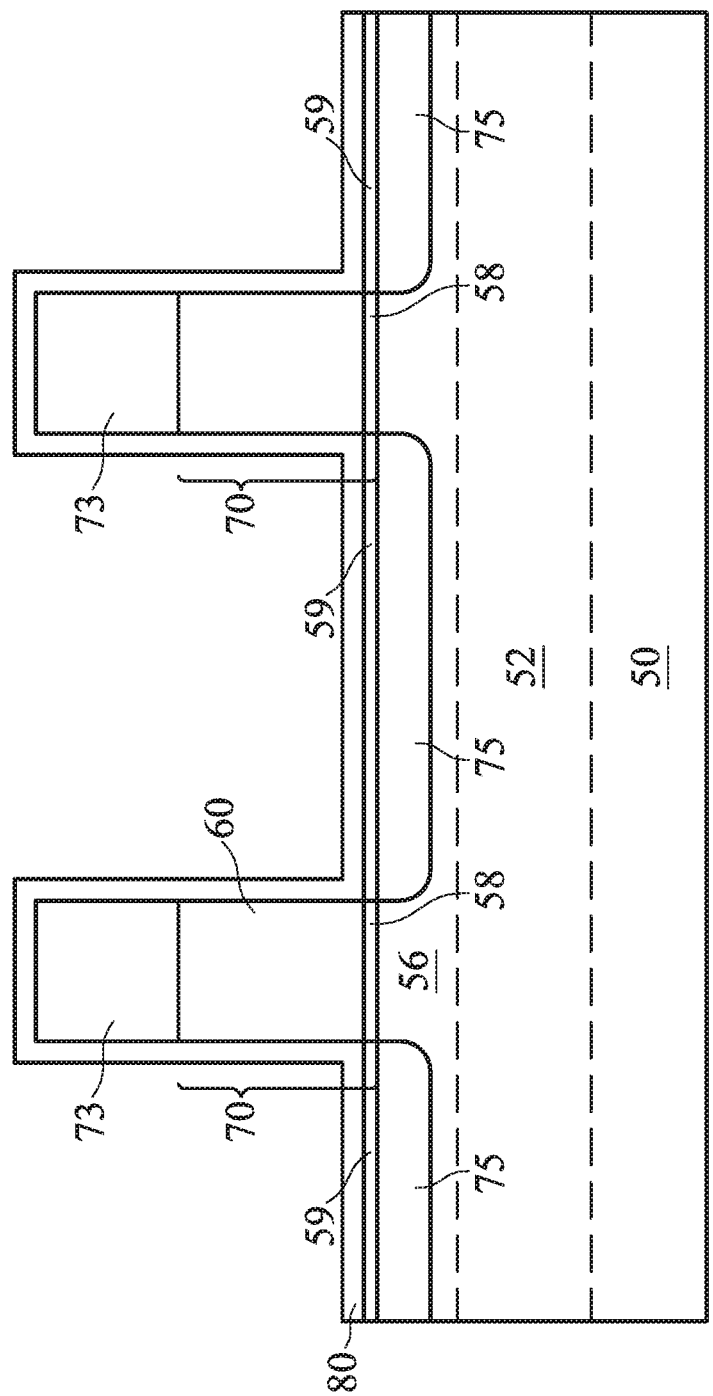
Figure 9C:
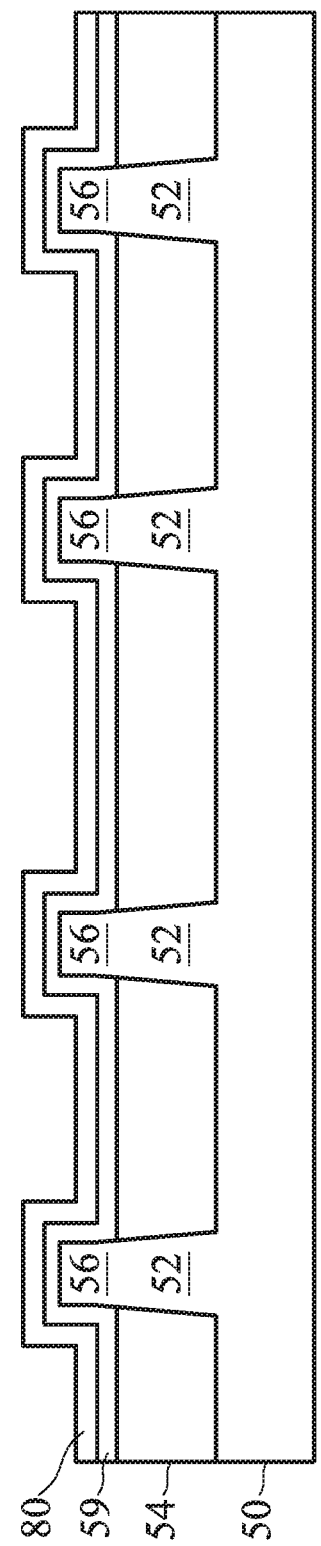

Referring to FIGS. 9A, 9B, and 9C, a fluorine addition process (a fluorination process) is performed on the patterned mask 72 and exposed portions of the dielectric layer 58 to form the fluorinated patterned mask 73 and the fluorinated regions 59 in the dielectric layer 58. In some embodiments where the dielectric layer 58 and the patterned mask 72 are formed of an oxide, such as silicon oxide, the fluorination process may comprise a plasma process, such as a SICONI process. In some embodiments, the SICONI process is a plasma process performed using a mixture of process gasses including $NF_3$, $NH_3$, a combination thereof, or the like. In some embodiments, the SICONI process may be performed at a temperature between about 90° C. and about 120° C. In some embodiments, the dielectric layer 80 protects the dielectric layer 58 and the patterned mask 72 from being etched during the fluorination process. Accordingly, in some embodiments, the dielectric layer 80 may be formed of a material that is not substantially etched during the fluorination process, allows for transferring fluorine atoms to underlying layers (such as the dielectric layer 58 and the patterned mask 72), and allows for protecting the dielectric layer 58 and the patterned mask 72 during the fluorination process. In some embodiment, the fluorinated patterned mask 73 may have an atomic fraction of fluorine between about 0.03 and about 0.05. In some embodiment, the fluorinated regions 59 of the dielectric layer 58 may have an atomic fraction of fluorine between about 0.03 and about 0.05.

Figure 10A:
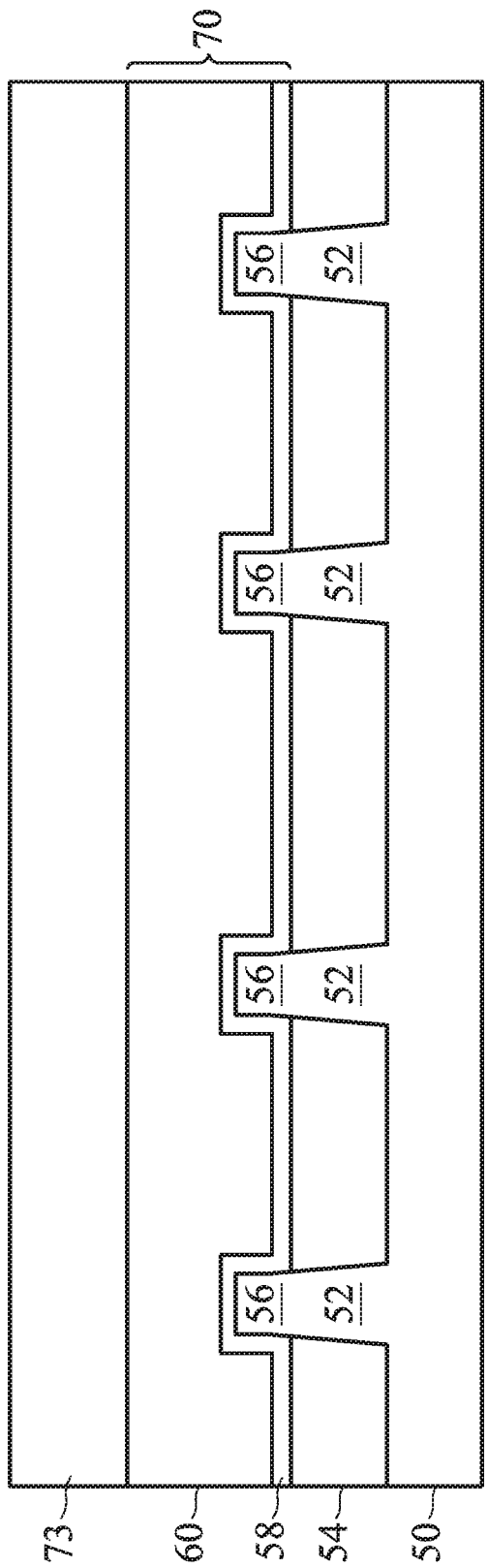
FIGS. 10A, 10B and 10C are cross-sectional views of intermediate stages in the manufacture of a FinFET device in accordance with some embodiments.
Figure 10B:
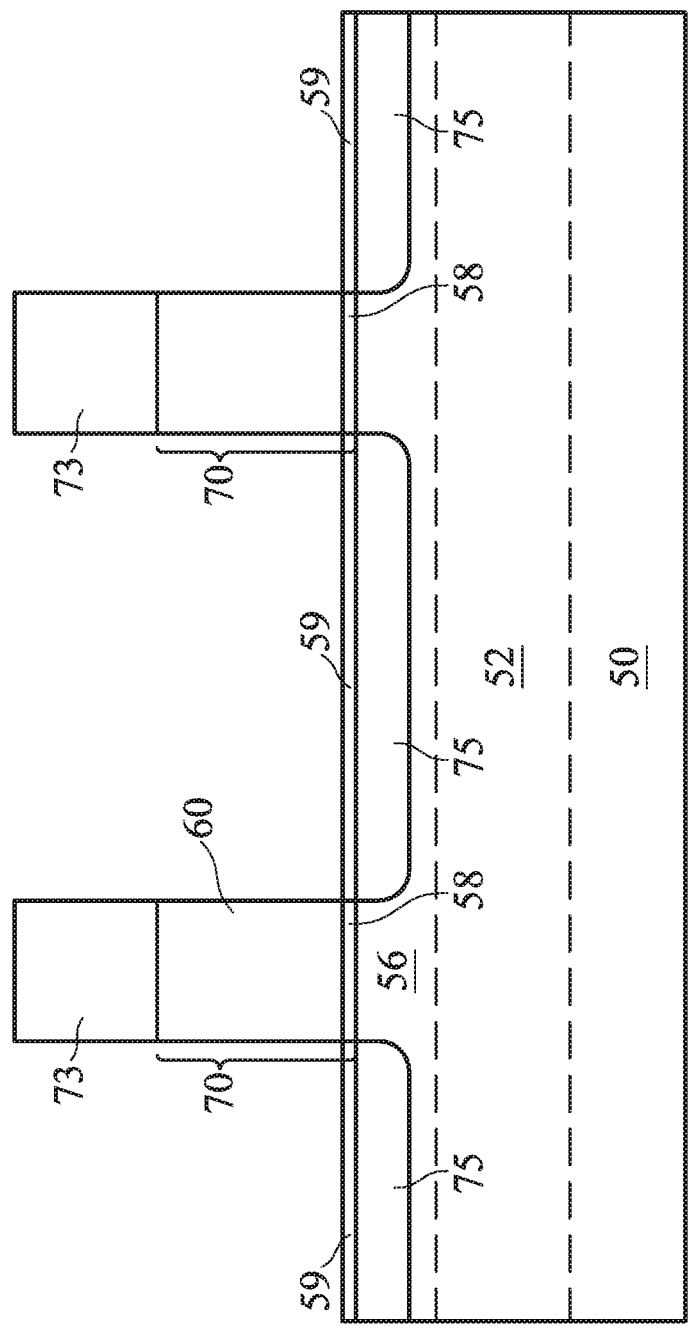
Figure 10C:
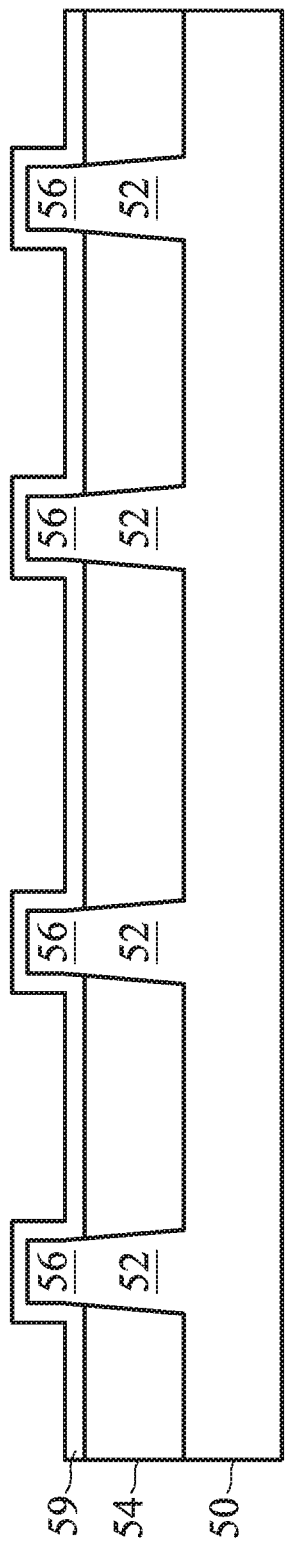

Referring to FIGS. 10A, 10B, and 10C, after completing the fluorination process described above, the dielectric layer 80 is removed. In some embodiment, the dielectric layer 80 may be selectively removed using a suitable etching process. In some embodiments where the dielectric layer 80 comprises aluminum oxide ($Al_2O_3$), the dielectric layer 80 may be removed using a dry etching process with a process gas comprising a mixture of $Cl_2$ and $SiCl_4$, a mixture of $Cl_2$ and $BCl_3$, a mixture of $Cl_2$ and HBr, or the like.

Figure 11A:
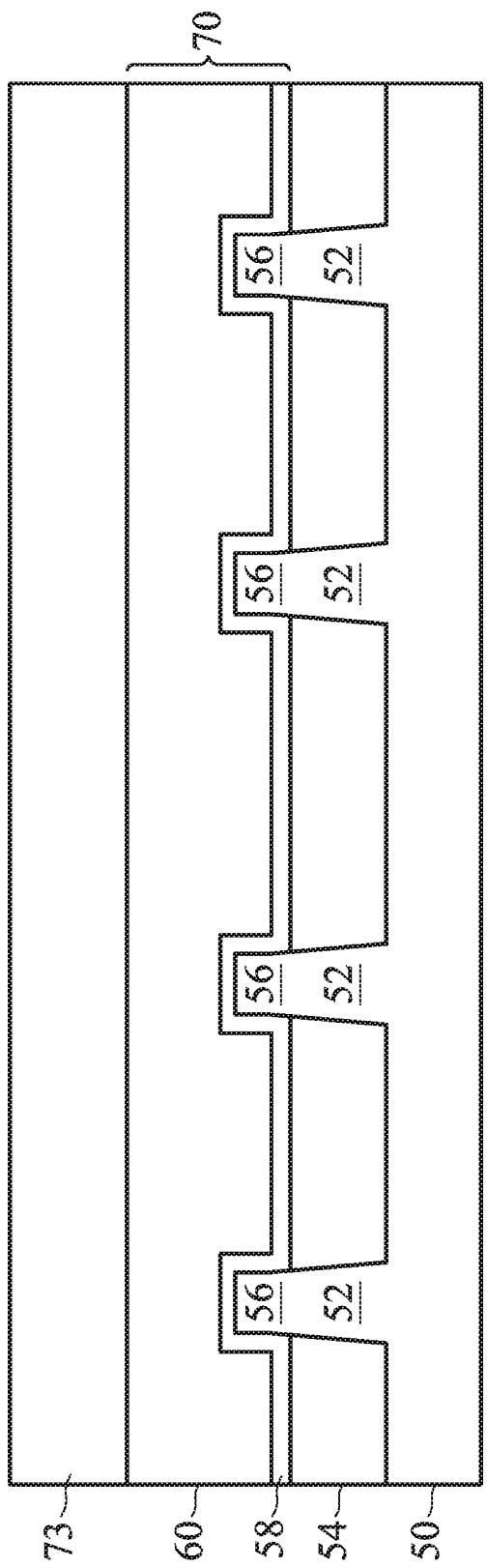
FIGS. 11A, 11B and 11C are cross-sectional views of intermediate stages in the manufacture of a FinFET device in accordance with some embodiments.
Figure 11B:
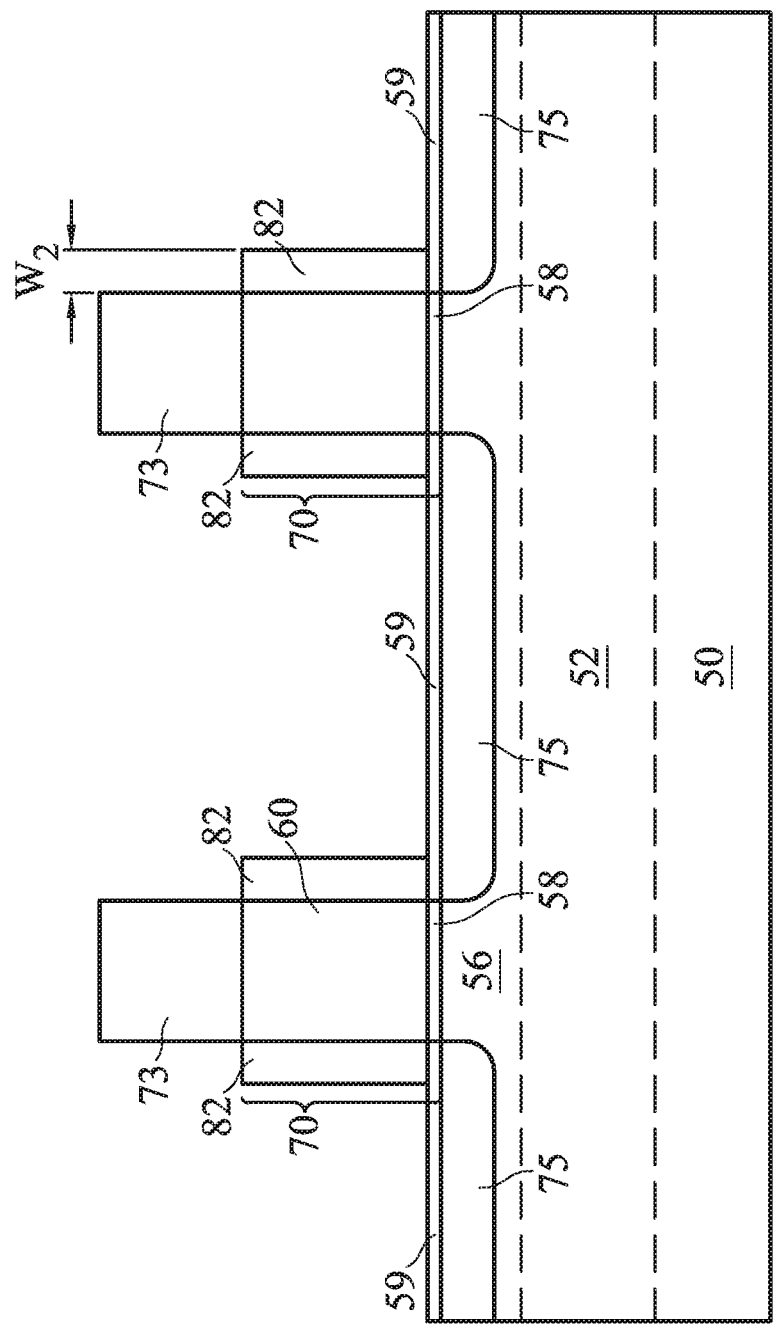
Figure 11C:
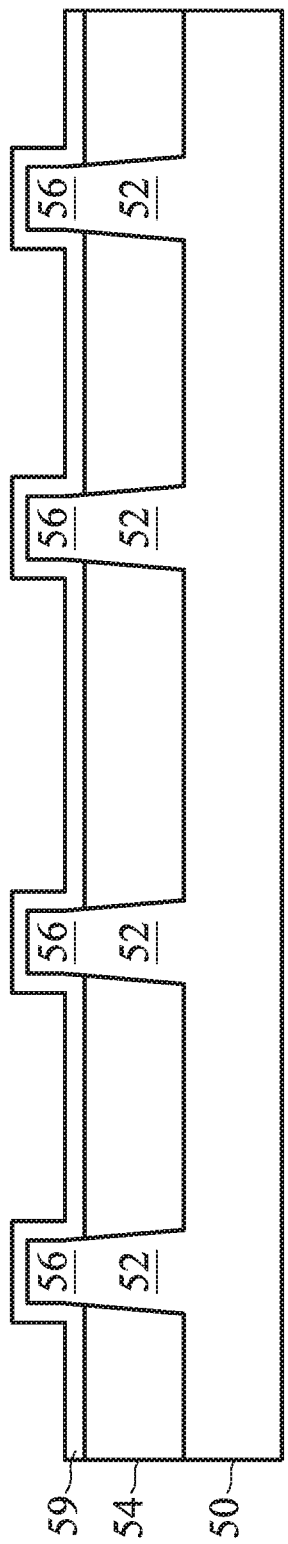

Referring to FIGS. 11A, 11B, and 11C, spacers 82 are selectively formed on the sidewalls of the gates 70. In some embodiments, the spacers 82 may comprise a dielectric material such as silicon nitride (SiN), silicon oxynitride (SiON), silicon oxycarbide (SiOC), silicon carbonitride (SiCN), silicon carboxynitride (SiOCN), a combination thereof, or the like, and may formed using CVD, ALD, a combination thereof, or the like. In some embodiments, a growth of a material of the spacers 82 is inhibited on exposed surfaces of the fluorinated patterned mask 73 and the fluorinated regions 59 of the dielectric layer 58. Accordingly, the spacers 82 are selectively formed on the sidewalls of the gates 70. By selectively forming the spacers 82, an anisotropic etching process is omitted, which allows for avoiding possible damage from the anisotropic etching process and provides well-defined nucleation areas for subsequently formed epitaxial source/drain regions. In some embodiments, the spacers 82 may have a width $W_2$ between about 1 nm and about 6 nm.

Figure 12A:
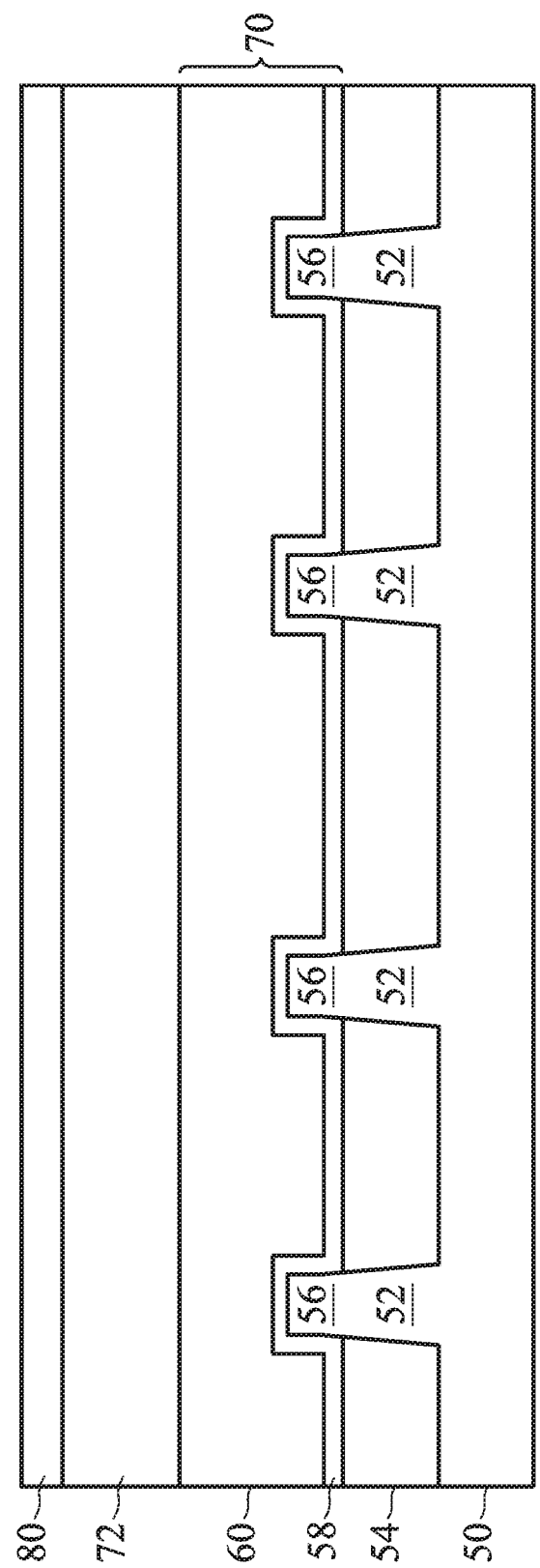
FIGS. 12A, 12B and 12C are cross-sectional views of intermediate stages in the manufacture of a FinFET device in accordance with some embodiments.
Figure 12B:
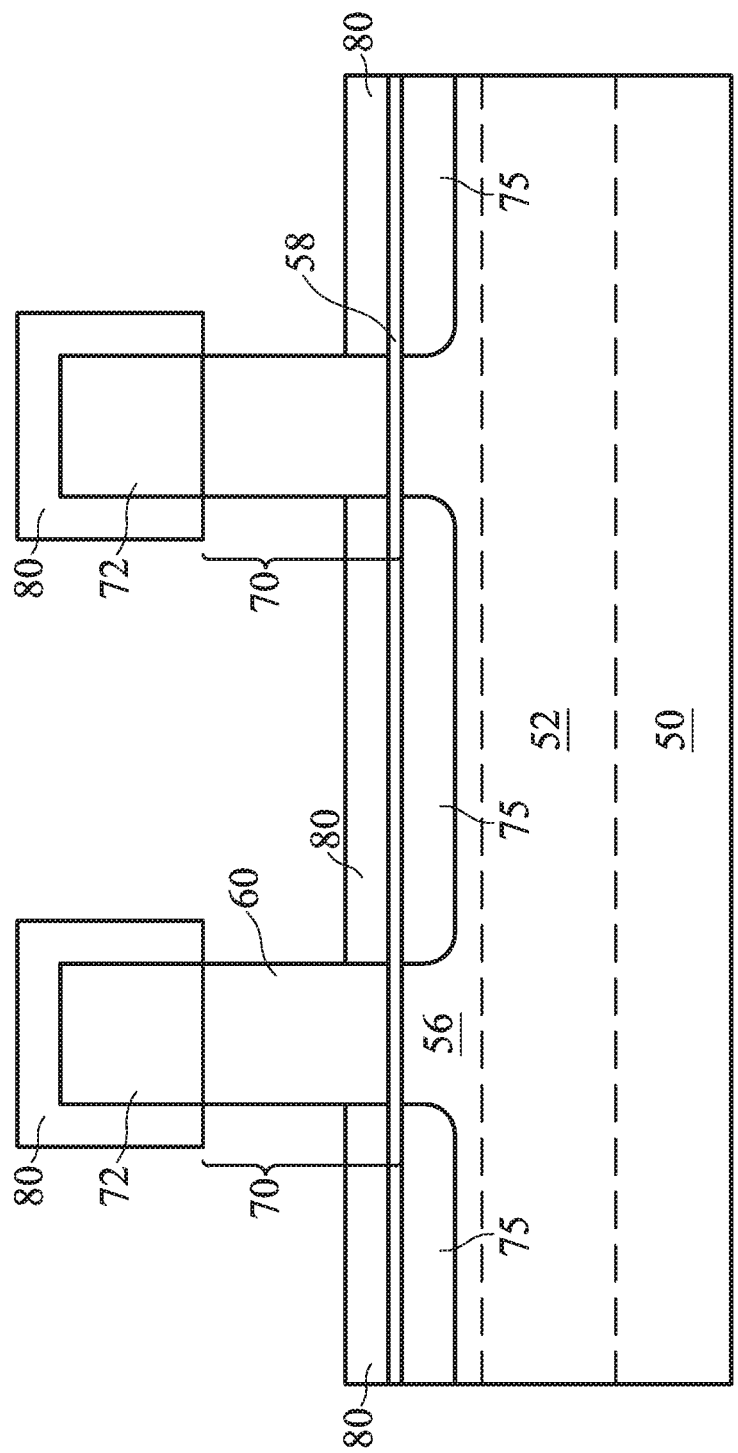
Figure 12C:
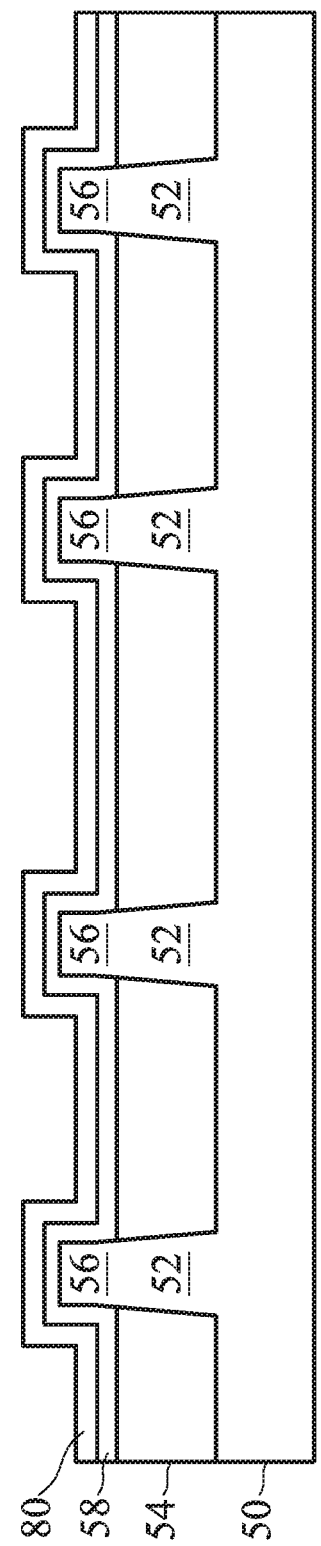

FIGS. 12A-15C illustrate the formation of spacers 82 on sidewalls of the gates 70 in accordance with alternative embodiments. Referring first to FIGS. 12A, 12B, and 12C, a dielectric layer 80 is selectively formed on exposed surfaces of the patterned mask 72 and the dielectric layer 58. In some embodiment, the dielectric layer 80 may comprises an oxide, such as aluminum oxide ($Al_2O_3$), or the like, and may be formed using CVD, ALD, or the like. In some embodiments, the selective formation of the dielectric layer 80 may be achieved by choosing an appropriate precursor for a material of the dielectric layer 80. In some embodiments where the dielectric layer 80 comprises aluminum oxide ($Al_2O_3$), the dielectric layer 80 may be selectively formed using a precursor comprising triisobutylaluminium (TiBA), tris(dimethylamido)aluminum, aluminum tris(2,2, 6,6-tetramethyl-3,5-heptanedionate), or the like. In some embodiments, the dielectric layer 80 may be formed at a pressure between about 0.5 Torr and about 10 Torr and at a temperature between about 25° C. and about 350° C. In some embodiments, the dielectric layer 80 may have a thickness between about 1 nm and about 6 nm.

Figure 13A:
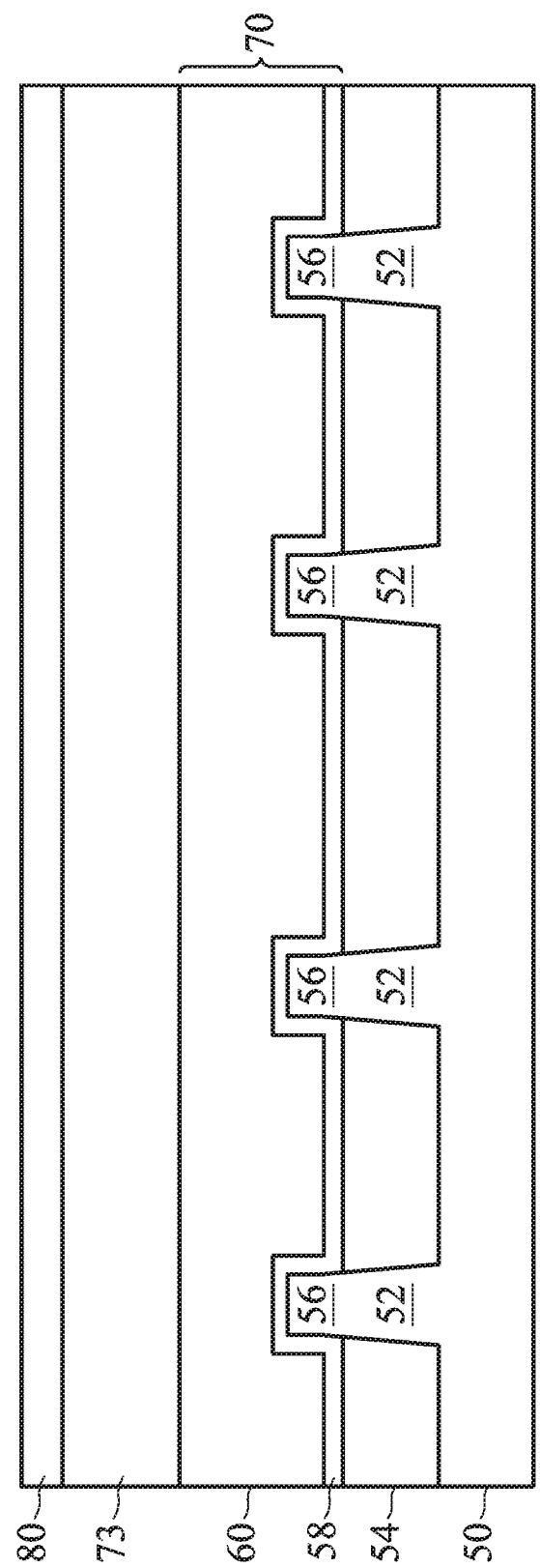
FIGS. 13A, 13B and 13C are cross-sectional views of intermediate stages in the manufacture of a FinFET device in accordance with some embodiments.
Figure 13B:
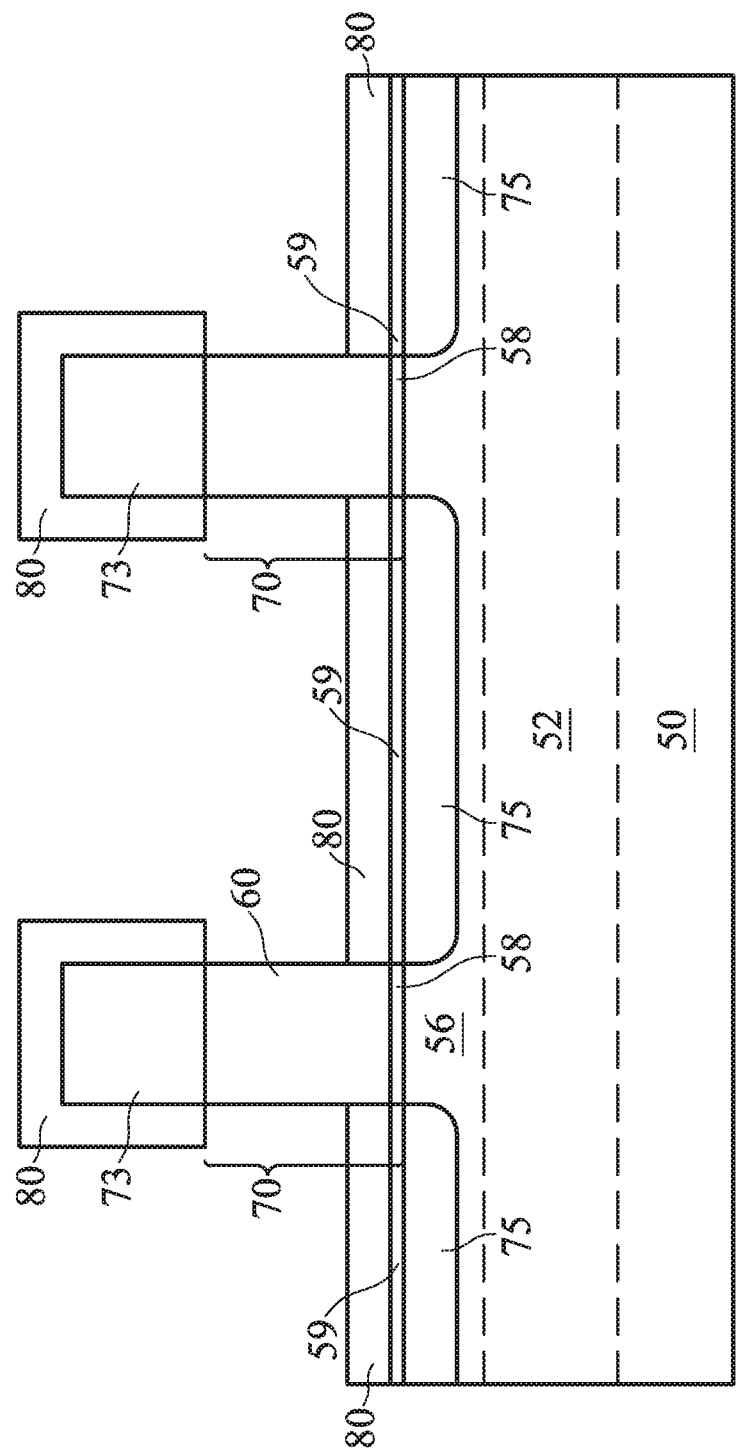
Figure 13C:
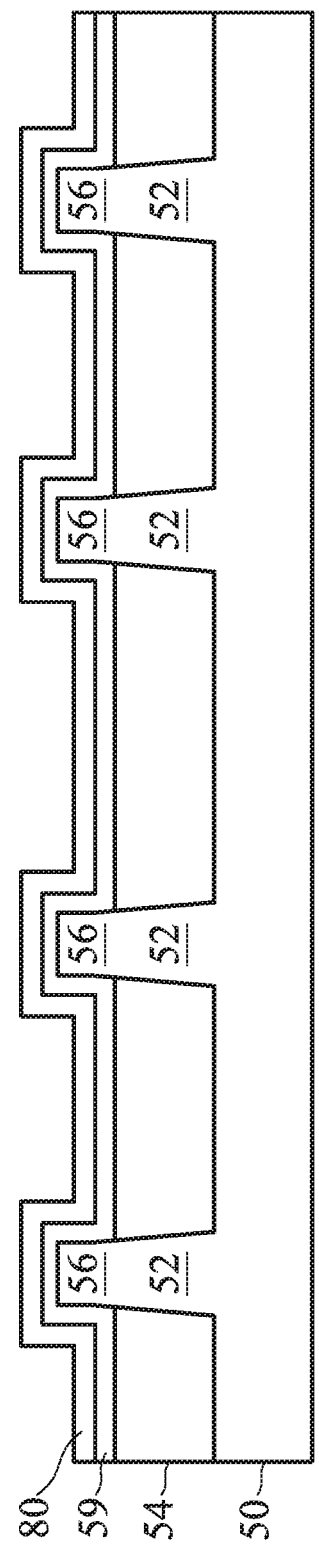

Referring to FIGS. 13A, 13B, and 13C, a fluorine addition process (a fluorination process) is performed on the patterned mask 72 and exposed portions of the dielectric layer 58 to form the fluorinated patterned mask 73 and the fluorinated regions 59 in the dielectric layer 58. In some embodiments where the dielectric layer 58 and the patterned mask 72 are formed of an oxide, such as silicon oxide, the fluorination process may comprise a plasma process, such as a SICONI process. In some embodiments, the SICONI process is a plasma process performed using a mixture of process gasses including $NF_3$, $NH_3$, a combination thereof, or the like. In some embodiments, the SICONI process may be performed at a temperature between about 90° C. and about 120° C. In some embodiments, the dielectric layer 80 protects the dielectric layer 58 and the patterned mask 72 from being etched during the fluorination process. Accordingly, in some embodiments, the dielectric layer 80 may be formed of a material that is not substantially etched during the fluorination process, allows for transferring fluorine atoms to underlying layers (such as the dielectric layer 58 and the patterned mask 72), and allows for protecting the dielectric layer 58 and the patterned mask 72 during the fluorination process. In some embodiment, the fluorinated patterned mask 73 may have an atomic fraction of fluorine between about 0.03 and about 0.05. In some embodiment, the fluorinated regions 59 of the dielectric layer 58 may have an atomic fraction of fluorine between about 0.03 and about 0.05.

Figure 14A:
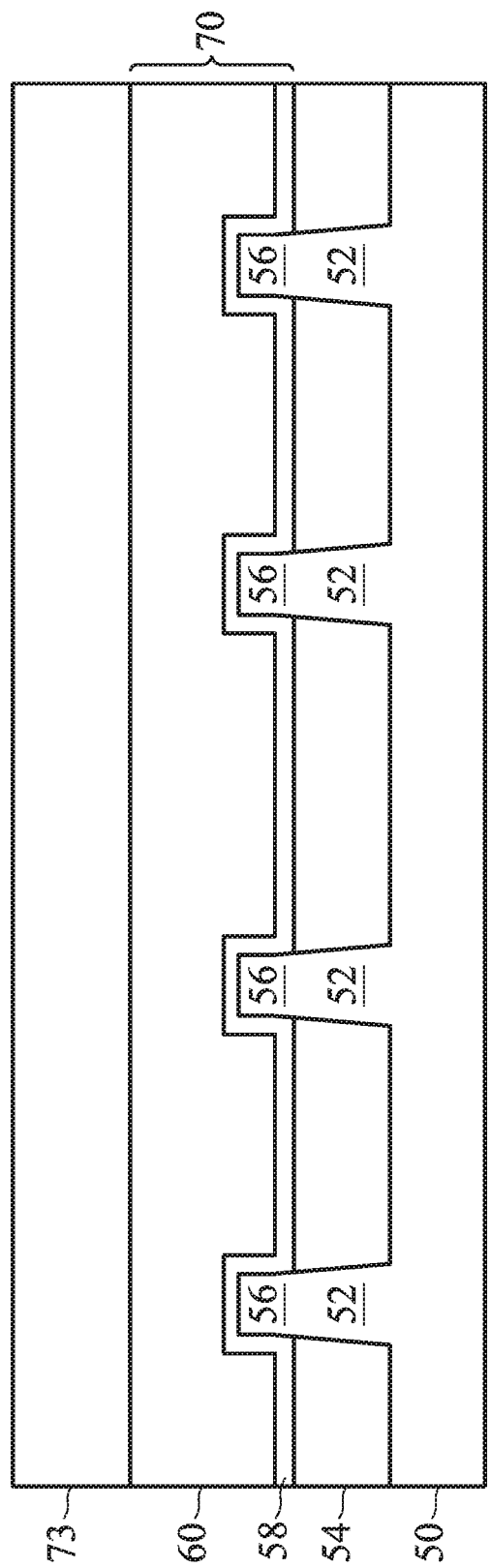
FIGS. 14A, 14B and 14C are cross-sectional views of intermediate stages in the manufacture of a FinFET device in accordance with some embodiments.
Figure 14B:
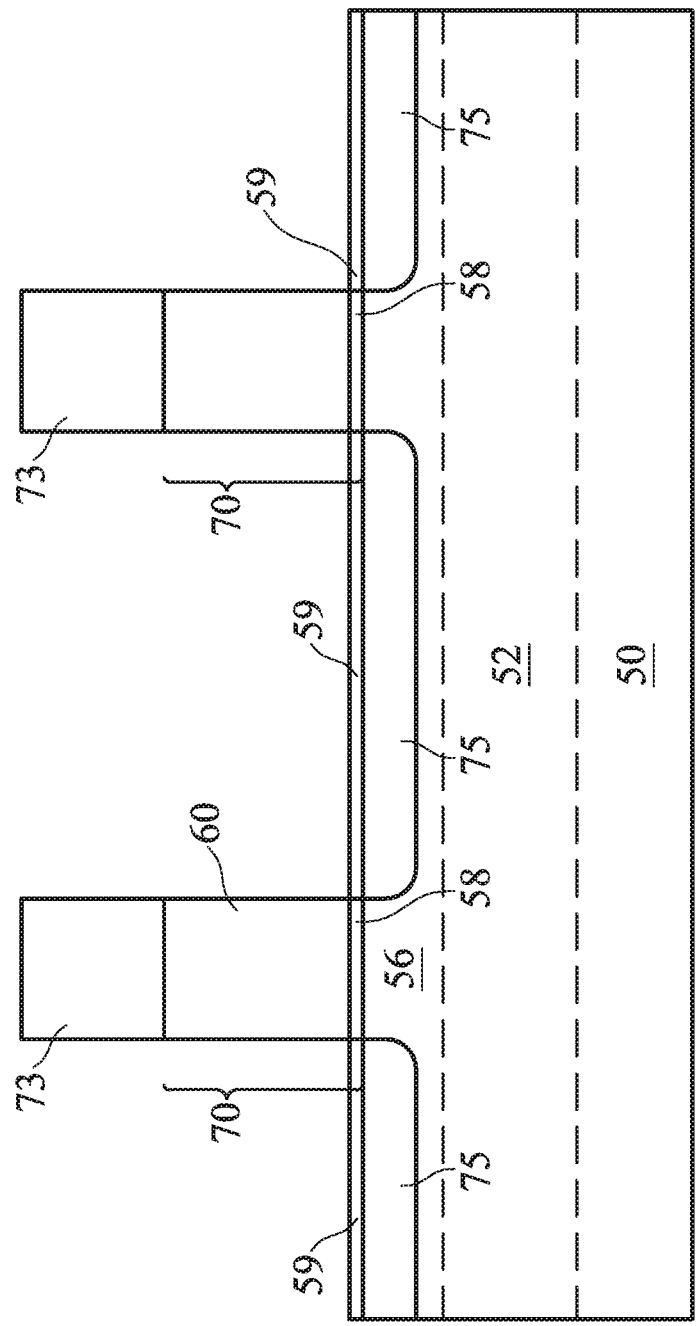
Figure 14C:
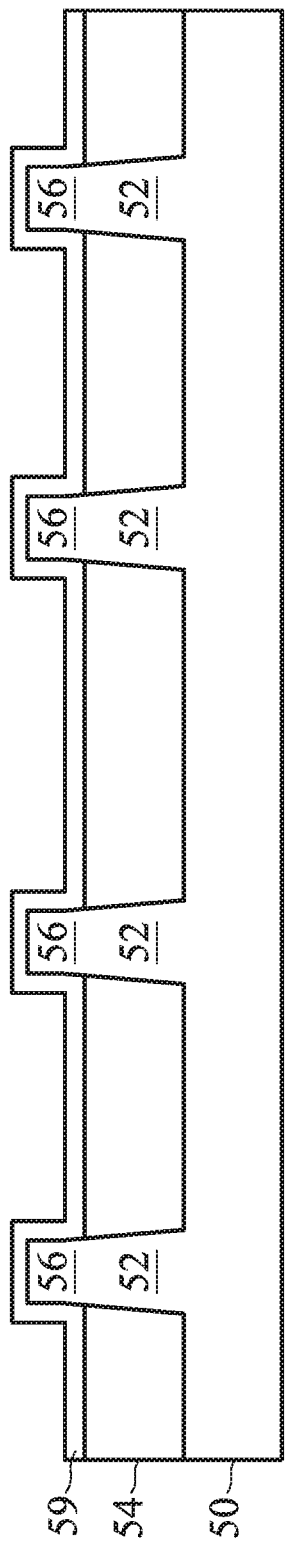

Referring to FIGS. 14A, 14B, and 14C, after completing the fluorination process described above, the dielectric layer 80 is removed. In some embodiment, the dielectric layer 80 may be selectively removed using a suitable etching process. In some embodiments where the dielectric layer 80 comprises aluminum oxide ($Al_2O_3$), the dielectric layer 80 may be removed using a dry etching process with a process gas comprising a mixture of $Cl_2$ and $SiCl_4$, a mixture of $Cl_2$ and $BCl_3$, a mixture of $Cl_2$ and HBr, or the like.

Figure 15A:
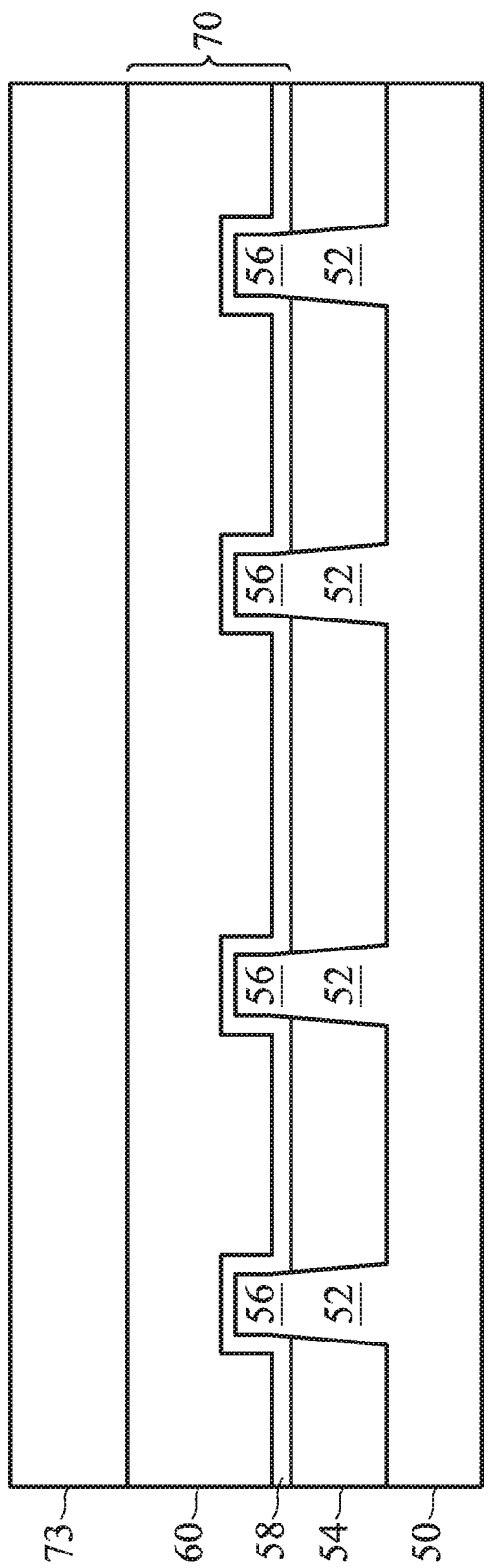
FIGS. 15A, 15B and 15C are cross-sectional views of intermediate stages in the manufacture of a FinFET device in accordance with some embodiments.
Figure 15B:
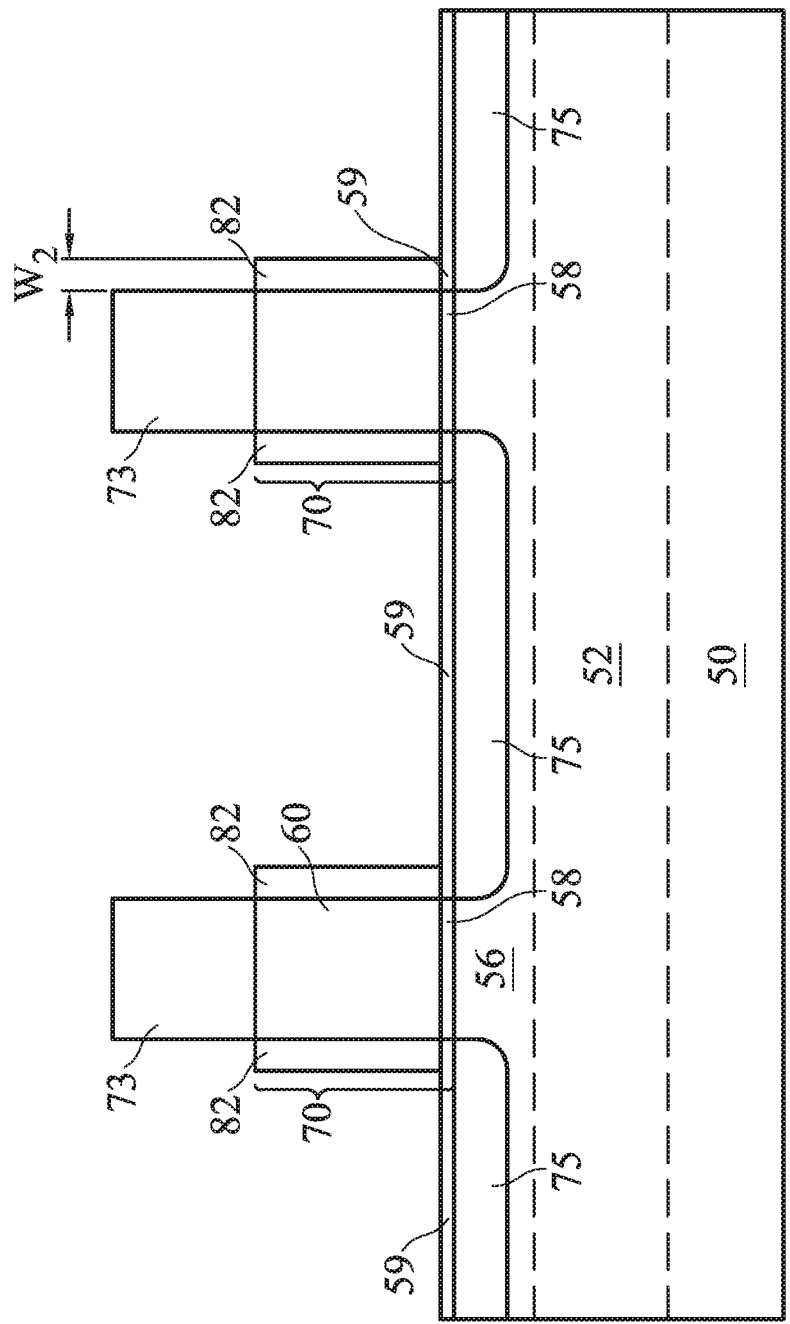
Figure 15C:
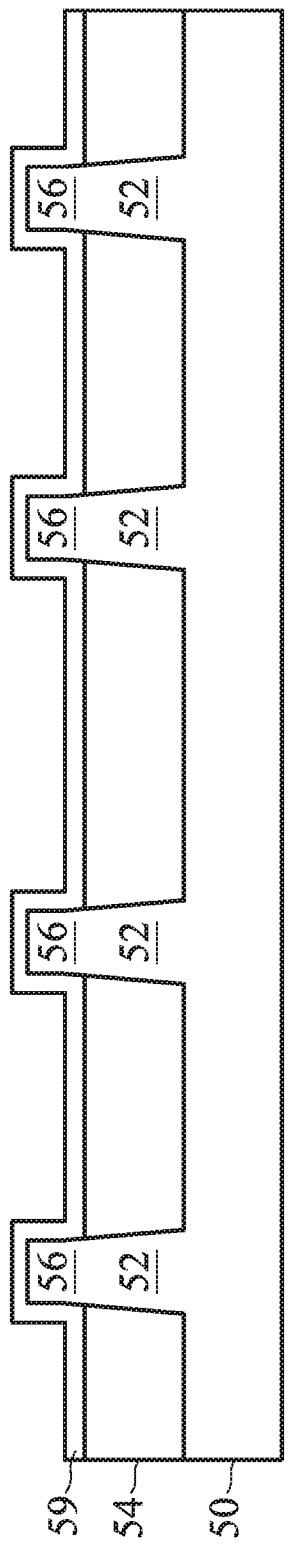

Referring to FIGS. 15A, 15B, and 15C, spacers 82 are selectively formed on the sidewalls of the gates 70. In some embodiments, the spacers 82 may comprise a dielectric material such as silicon nitride (SiN), silicon oxynitride (SiON), silicon oxycarbide (SiOC), silicon carbonitride (SiCN), silicon carboxynitride (SiOCN), a combination thereof, or the like, and may formed using CVD, ALD, a combination thereof, or the like. In some embodiments, a growth of a material of the spacers 82 is inhibited on exposed surfaces of the fluorinated patterned mask 73 and the fluorinated regions 59 of the dielectric layer 58. Accordingly, the spacers 82 are selectively formed on the sidewalls of the gates 70. By selectively forming the spacers 82, an anisotropic etching process is omitted, which allows for avoiding possible damage form the anisotropic etching process and provides well-defined nucleation areas for subsequently formed epitaxial source/drain regions. In some embodiments, the spacers 82 may have a width $W_2$ between about 1 nm and about 6 nm.

Figure 16A:
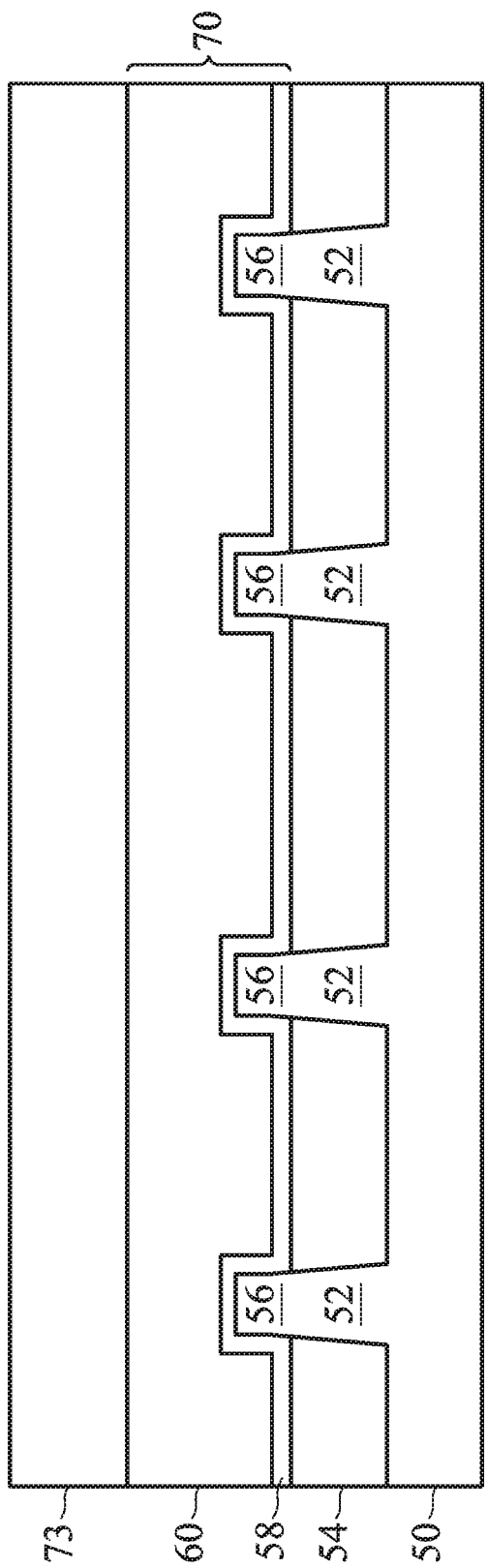
FIGS. 16A, 16B and 16C are cross-sectional views of intermediate stages in the manufacture of a FinFET device in accordance with some embodiments.
Figure 16B:
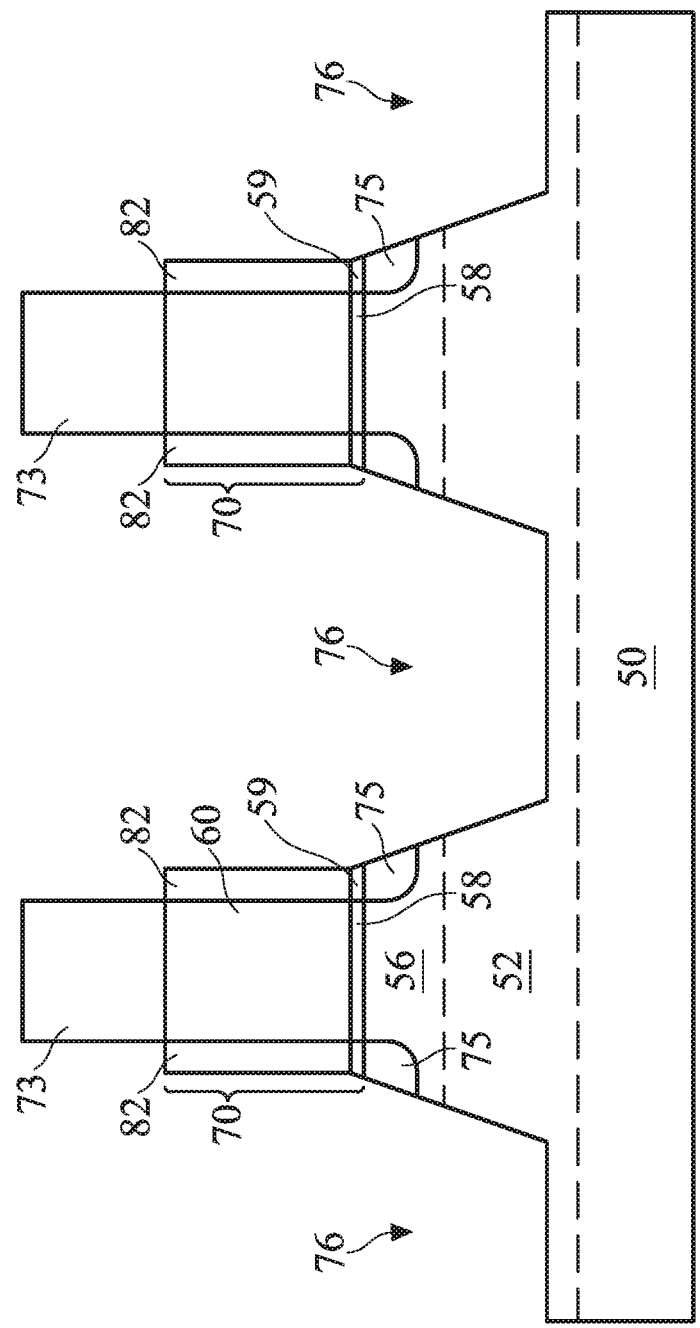
Figure 16C:
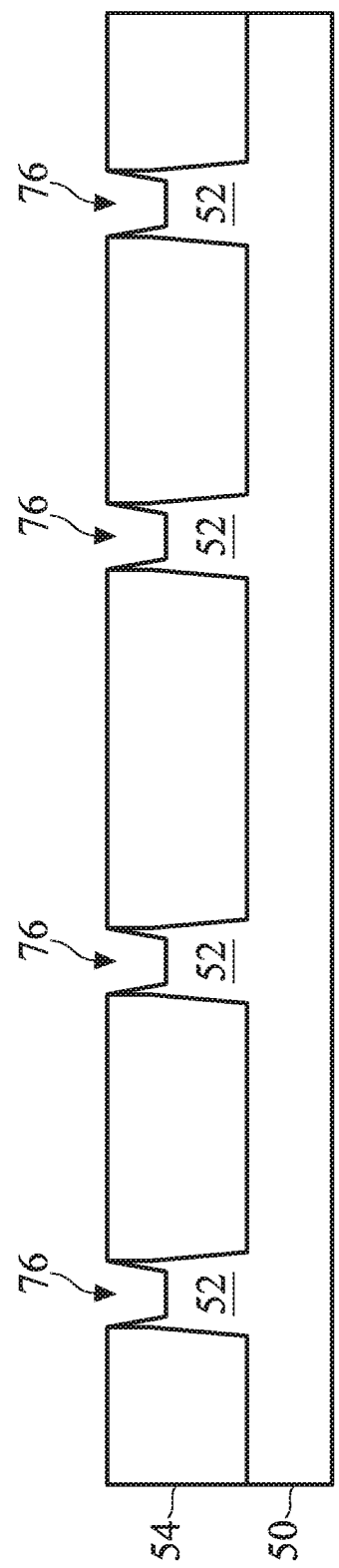

Referring to FIGS. 16A, 16B, and 16C, after selectively forming the spacers 82 on the sidewalls of the gates 70, a patterning process is performed on the fins 56 to form recesses 76 in the source/drain regions of the fins 56. In some embodiments, the patterning process may include a suitable anisotropic dry etching process, while using the fluorinated patterned mask 73, the gates 70, the spacers 82, and/or isolation regions 54 as a combined mask. The suitable anisotropic dry etching process may include a reactive ion etch (RIE), a neutral beam etch (NBE), a combination thereof, or the like. In some embodiments, the fluorinated regions 59 of the dielectric layer 58 may be removed over the isolation regions 54 during the patterning process.

Figure 17A:
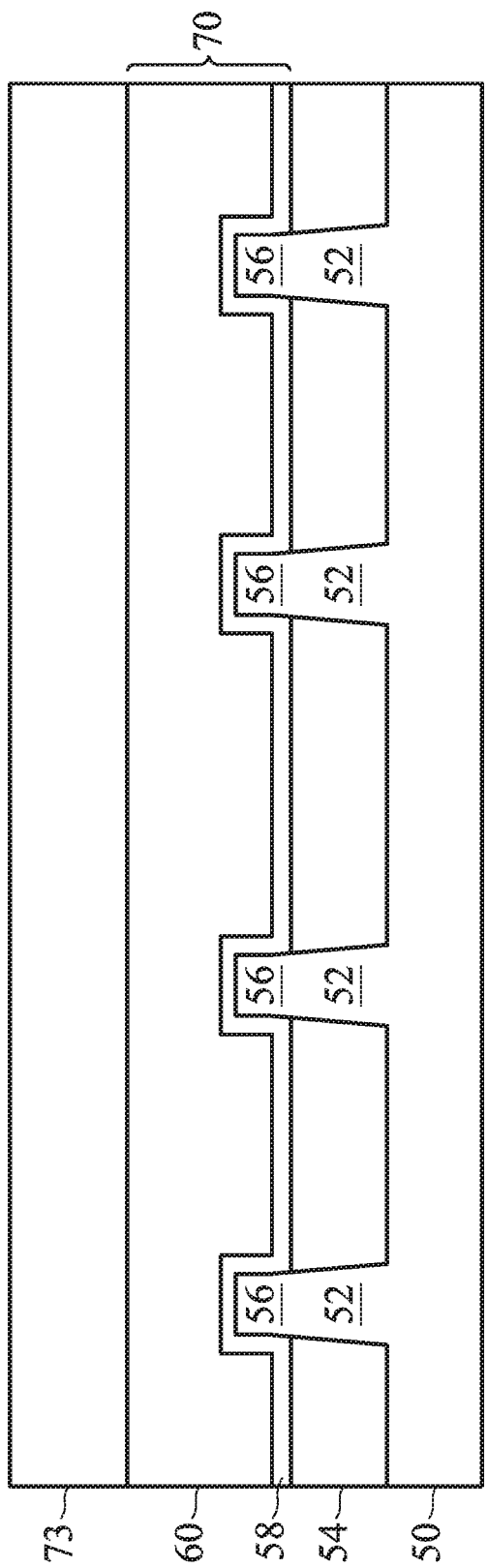
FIGS. 17A, 17B and 17C are cross-sectional views of a FinFET device in accordance with some embodiments.
Figure 17B:
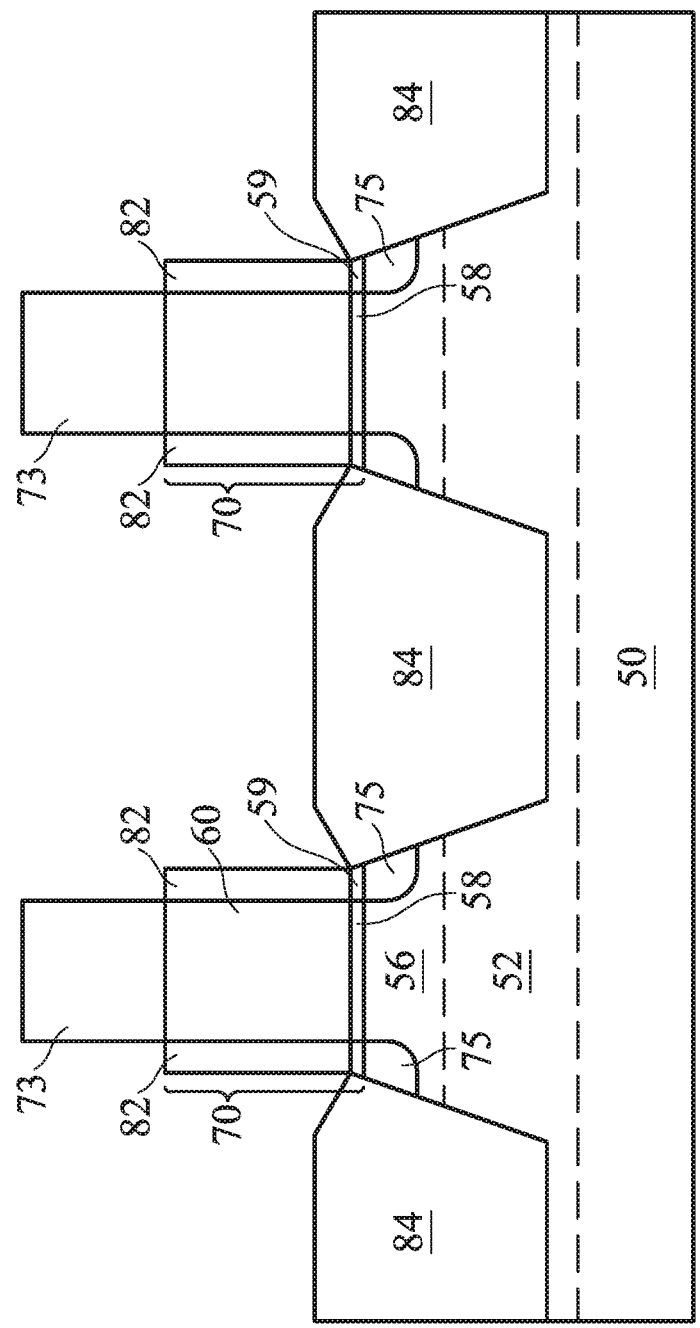
Figure 17C:
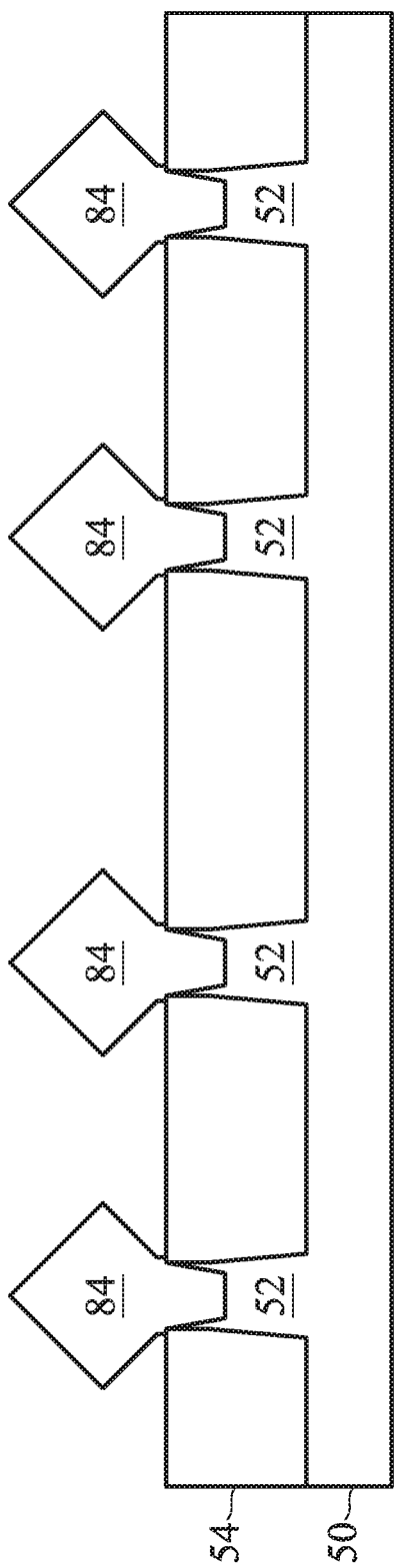

Referring to FIGS. 17A, 17B, and 17C, epitaxial source/drain regions 84 are formed in the recesses 76 (see FIGS. 16A, 16B, and 16C). In some embodiments, the epitaxial source/drain regions 84 are epitaxially grown in the recesses 76 using metal-organic CVD (MOCVD), molecular beam epitaxy (MBE), liquid phase epitaxy (LPE), vapor phase epitaxy (VPE), selective epitaxial growth (SEG), a combination thereof, or the like. In some embodiments where the resulting FinFET device is an n-type device and the fins 56 are formed of silicon, the epitaxial source/drain regions 84 may include silicon, SiC, SiCP, SiP, or the like. In some embodiments where the resulting FinFET device is a p-type device and the fins 56 are formed of silicon, the epitaxial source/drain regions 84 may include SiGe, SiGeB, Ge, GeSn, or the like. The epitaxial source/drain regions 84 may have surfaces raised from respective surfaces of the fins 56 and may have facets. In some embodiments, the epitaxial source/drain regions 84 may extend past the fins 56 and into the semiconductor strips 52. In some embodiments, the material of the epitaxial source/drain regions 84 may be implanted with suitable dopants. In some embodiments, the implantation process is similar to the process used for forming the LLD regions 75 as described above with reference to FIGS. 7A, 7B, and 7C, and the description is not repeated herein for the sake of brevity. In other embodiments, the material of the epitaxial source/drain regions 84 may be in situ doped during growth.

Figure 22A:
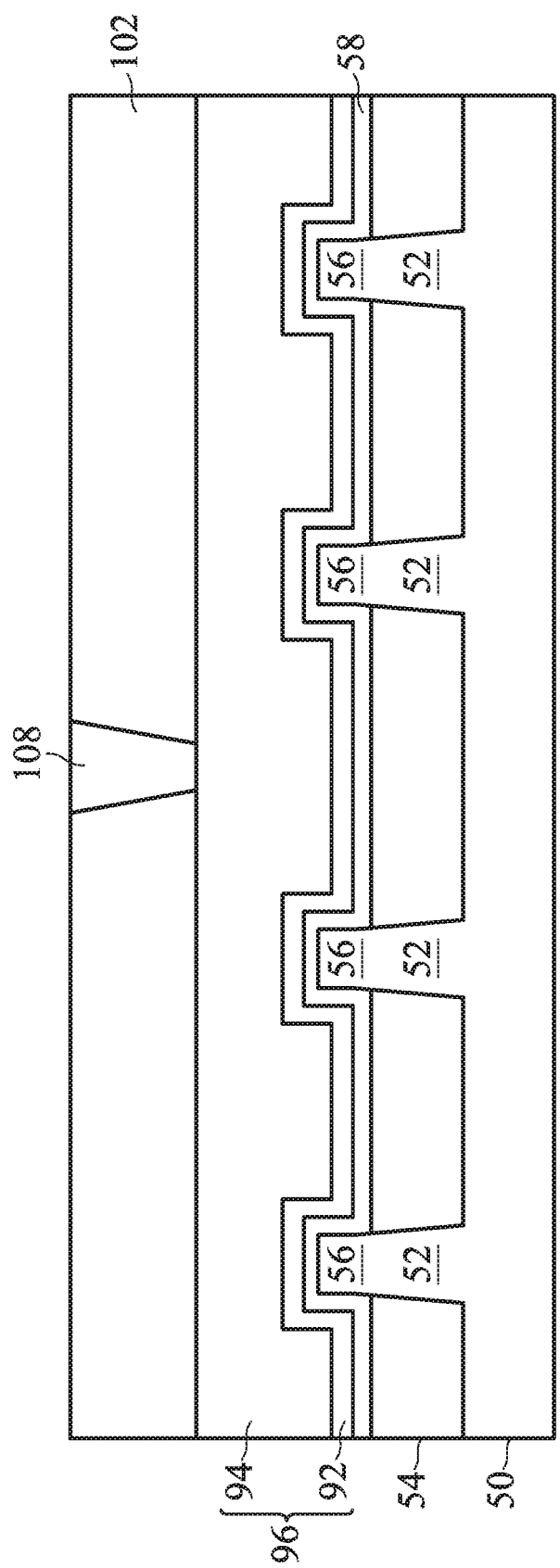
FIGS. 22A, 22B and 22C are cross-sectional views of a FinFET device in accordance with some embodiments.
Figure 22B:
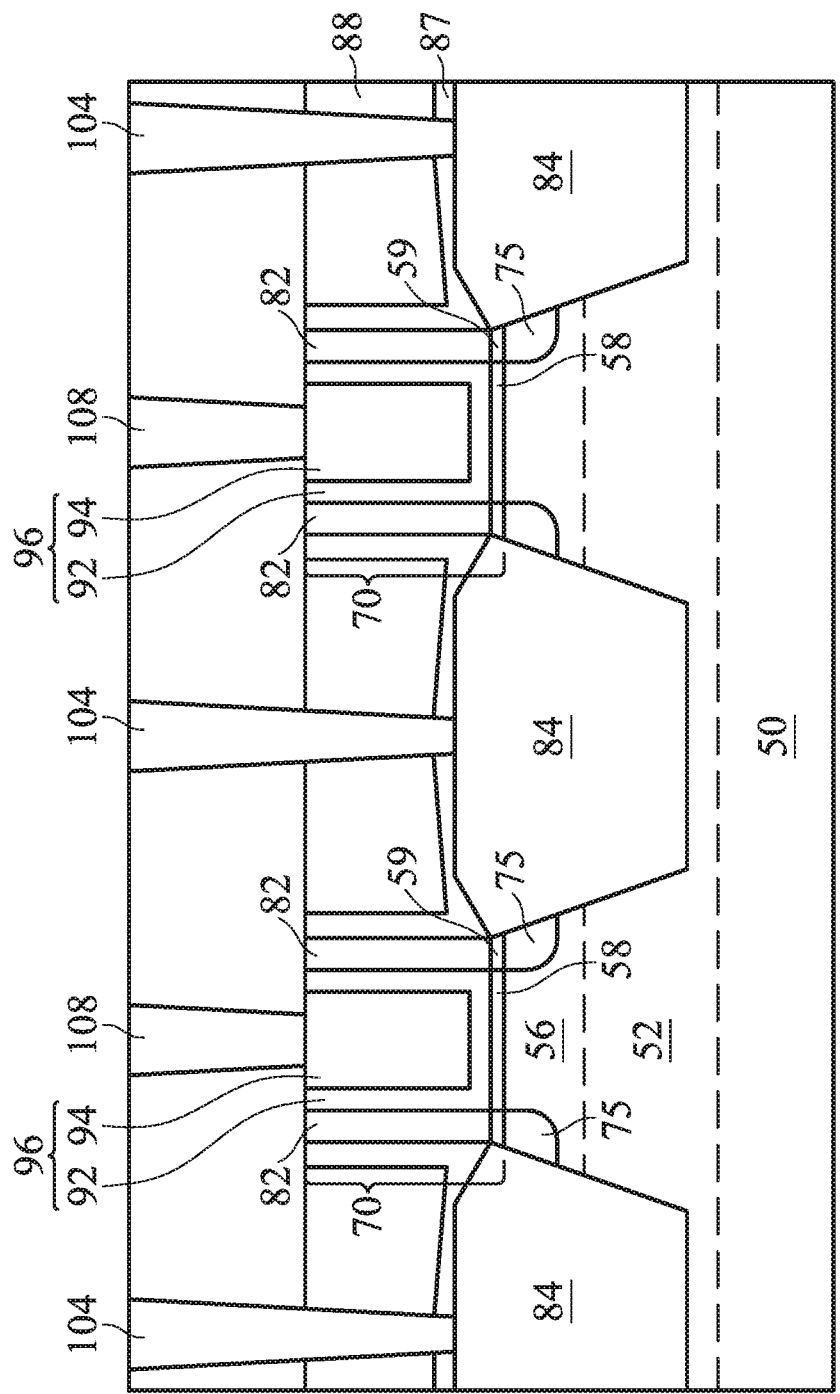
Figure 22C:
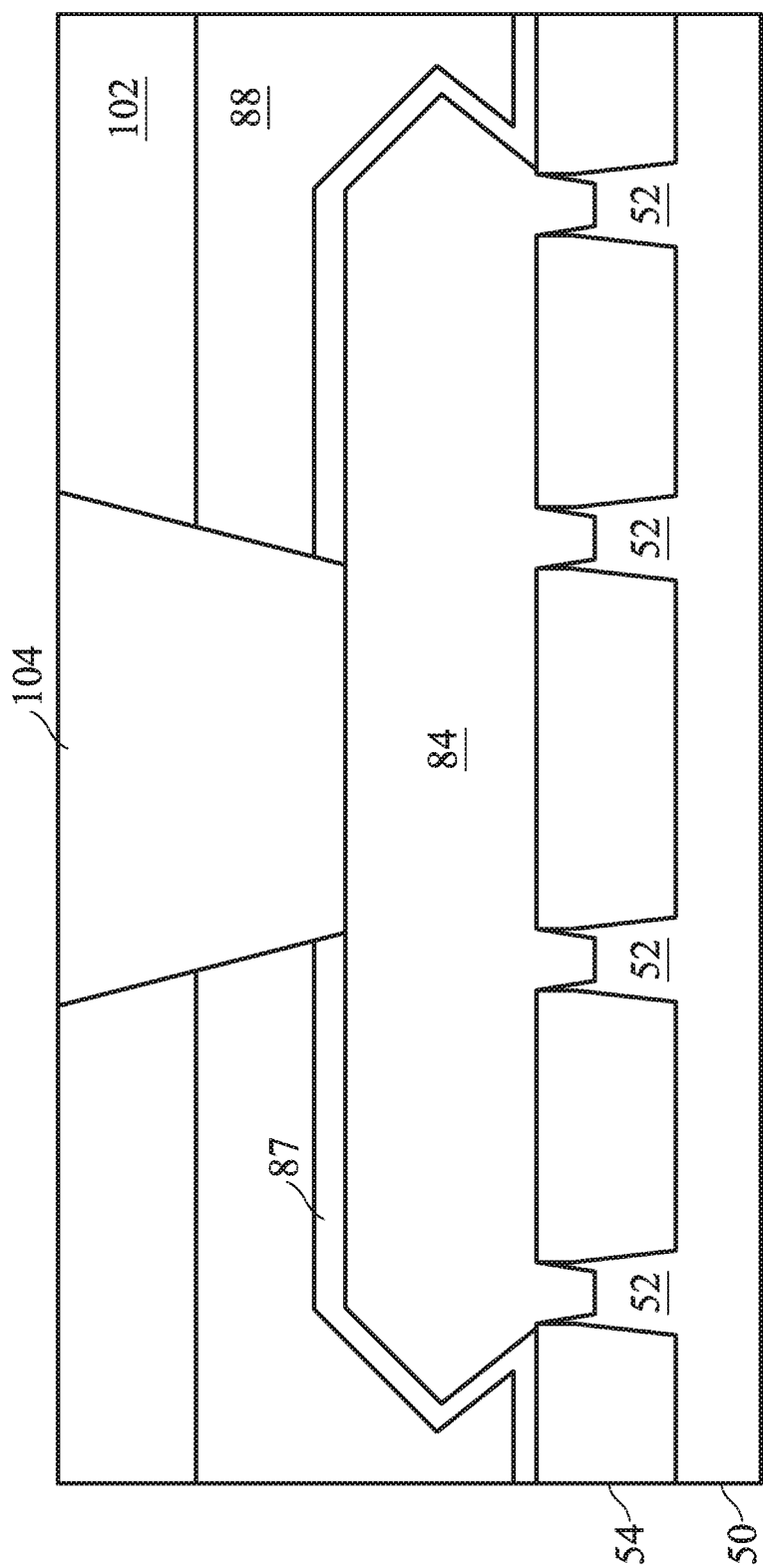

Referring further to FIGS. 17A, 17B, and 17C, in the illustrated embodiment, each of the epitaxial source/drain regions 84 are physically separate from other epitaxial source/drain regions 84. In other embodiments, adjacent epitaxial source/drain regions 84 may be merged. Such an embodiment is depicted in FIGS. 22A, 22B, and 22C, where adjacent epitaxial source/drain regions 84 are merged to form a common epitaxial source/drain region 84.

Figure 18A:
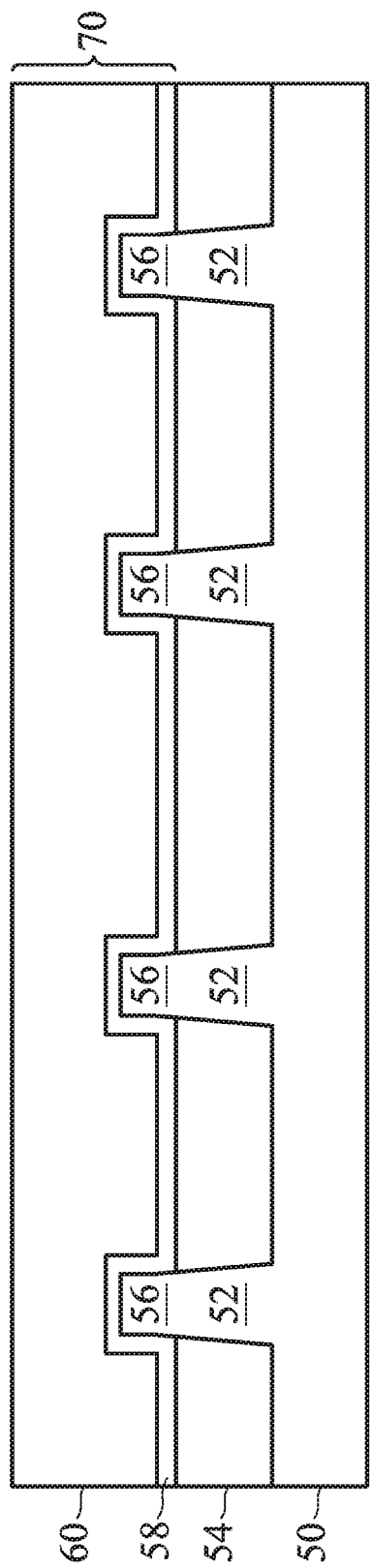
FIGS. 18A, 18B and 18C are cross-sectional views of a FinFET device in accordance with some embodiments.
Figure 18B:
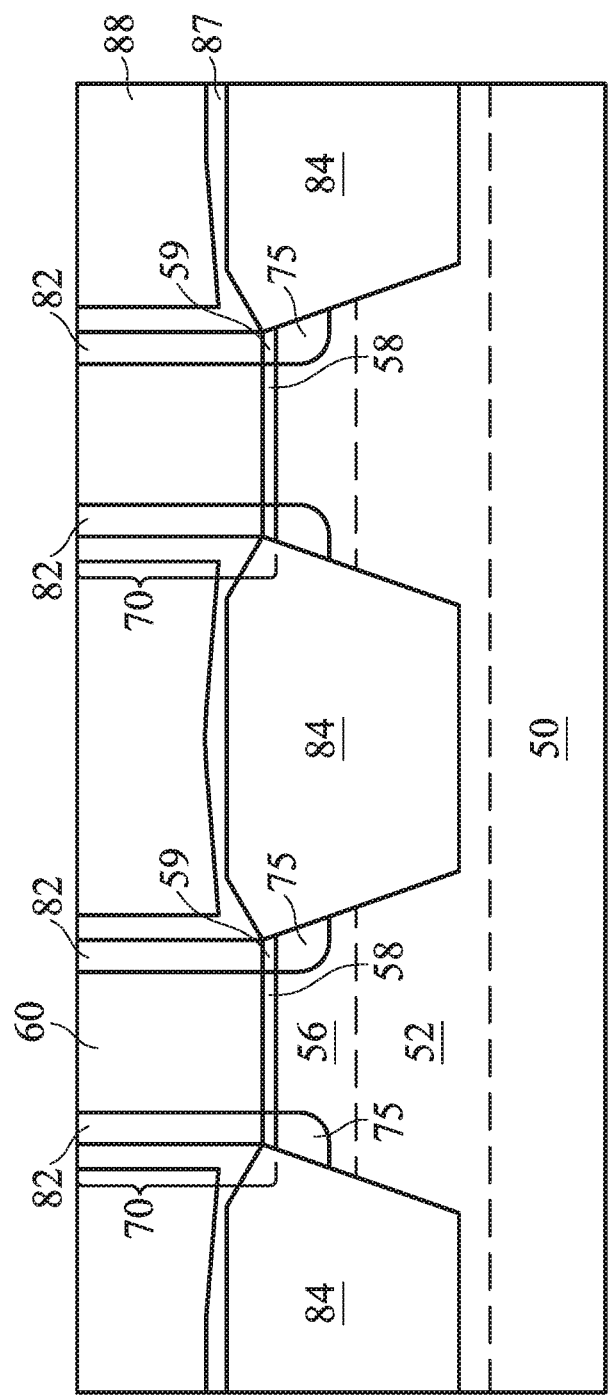
Figure 18C:
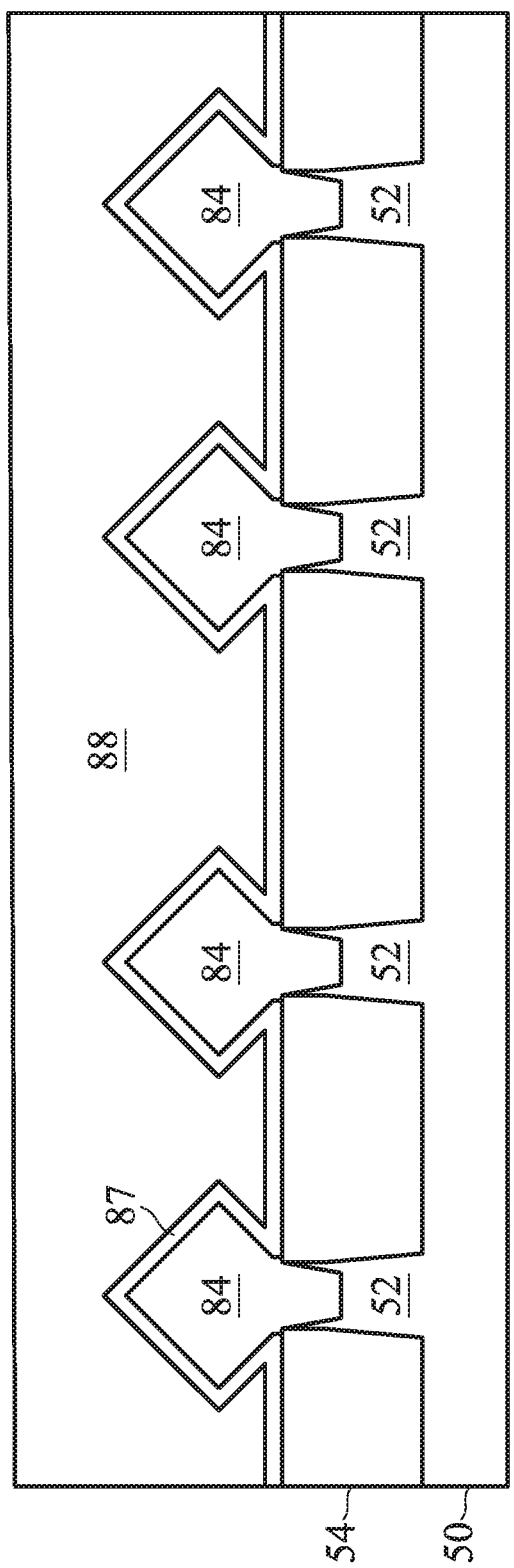

Referring to FIGS. 18A, 18B, and 18C, an etch stop layer 87 and an interlayer dielectric (ILD) 88 are deposited over the gates 70, and over the epitaxial source/drain regions 84. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, PECVD, a spin-on-glass process, a combination thereof, or the like. In some embodiments, the etch stop layer 87 is used as a stop layer while patterning the ILD 88 to form openings for subsequently formed contacts. Accordingly, a material for the etch stop layer 87 may be chosen such that the material of the etch stop layer 87 has a lower etch rate than the material of ILD 88. In some embodiments, a planarization process, such as a CMP, may be performed to level the top surface of ILD 88 with the top surfaces of the gates 70. In some embodiments, the planarization process also removes the fluorinated patterned mask 73.

Figure 19A:
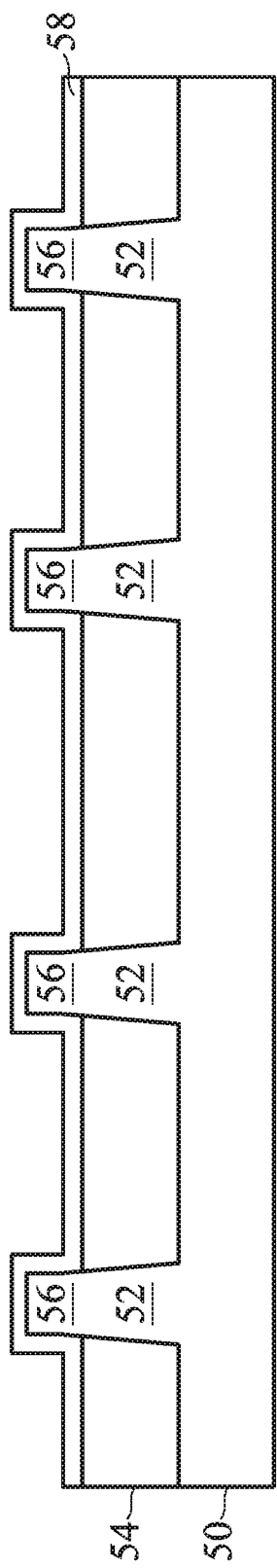
FIGS. 19A, 19B and 19C are cross-sectional views of a FinFET device in accordance with some embodiments.
Figure 19B:
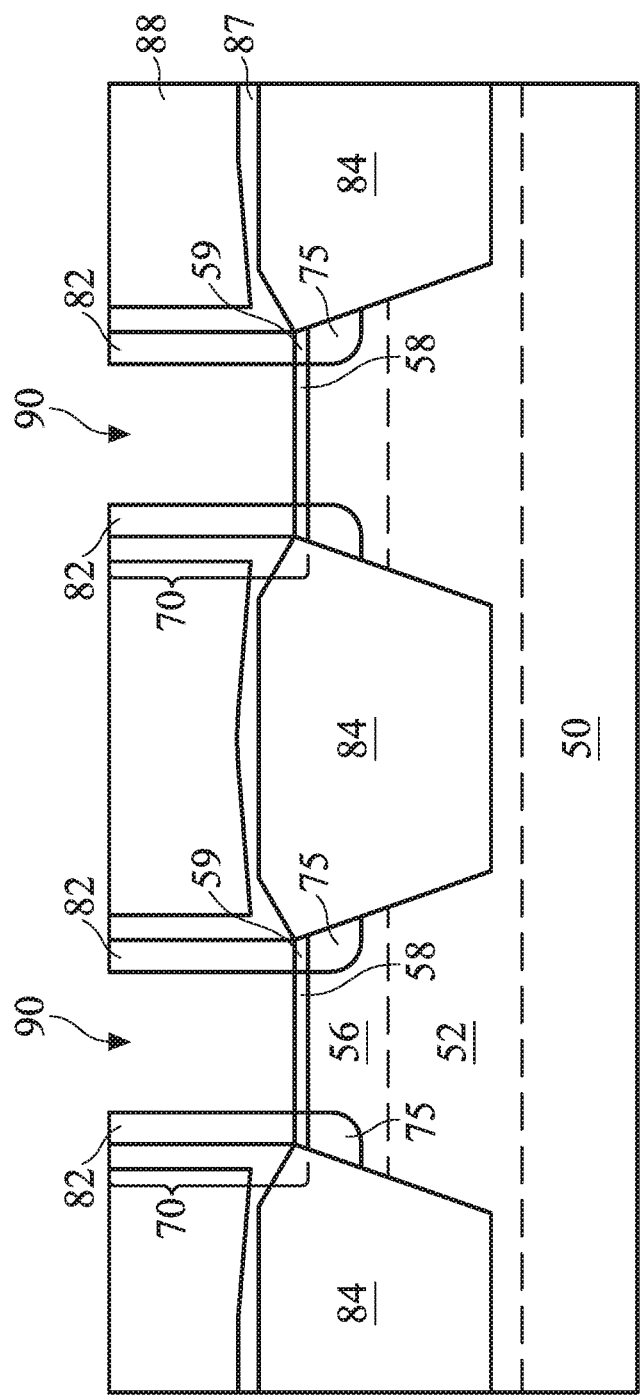
Figure 19C:
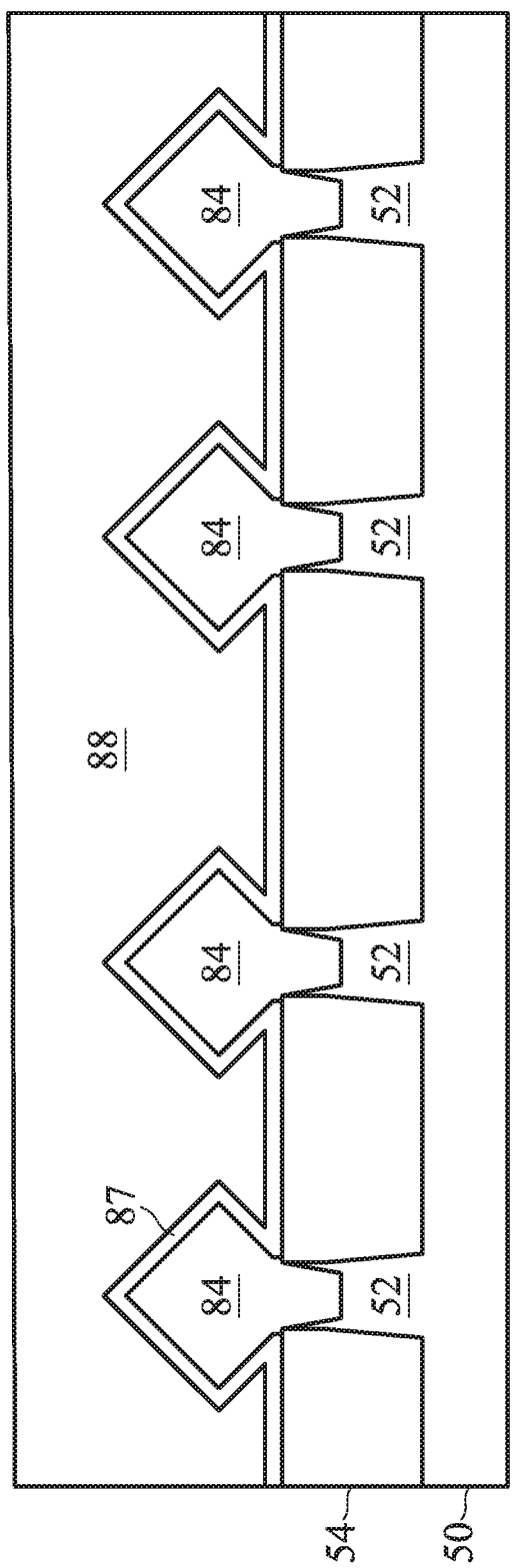

Referring to FIGS. 19A, 19B, and 19C, the gates 70 (see FIGS. 18A, 18B, and 18C) are removed to form recesses 90 in the ILD 88. In some embodiments, the gates 70 may be removed using one or more suitable etching processes. Each of the recesses 90 exposes a channel region of a respective fin 56. In some embodiments, the dielectric layer 58 may be used as an etch stop layer when the gates 70 are etched. In some embodiments, after removing the gate electrode layers 60 of the gates 70, exposed portions of the dielectric layer 58 may be also removed. In some embodiments, the exposed portions of the dielectric layer 58 may remain in the recesses 90.

Figure 20A:
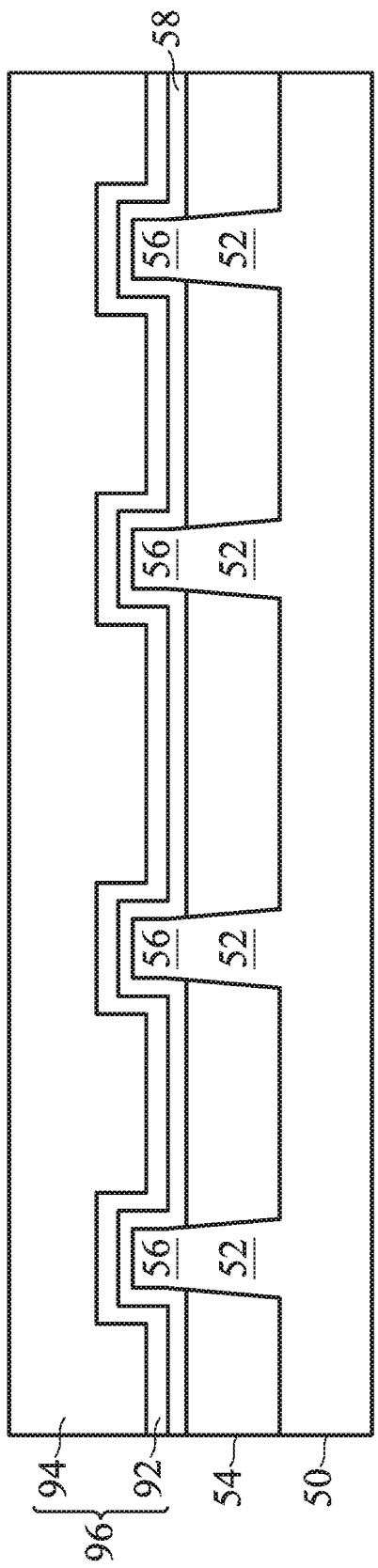
FIGS. 20A, 20B and 20C are cross-sectional views of a FinFET device in accordance with some embodiments.
Figure 20B:
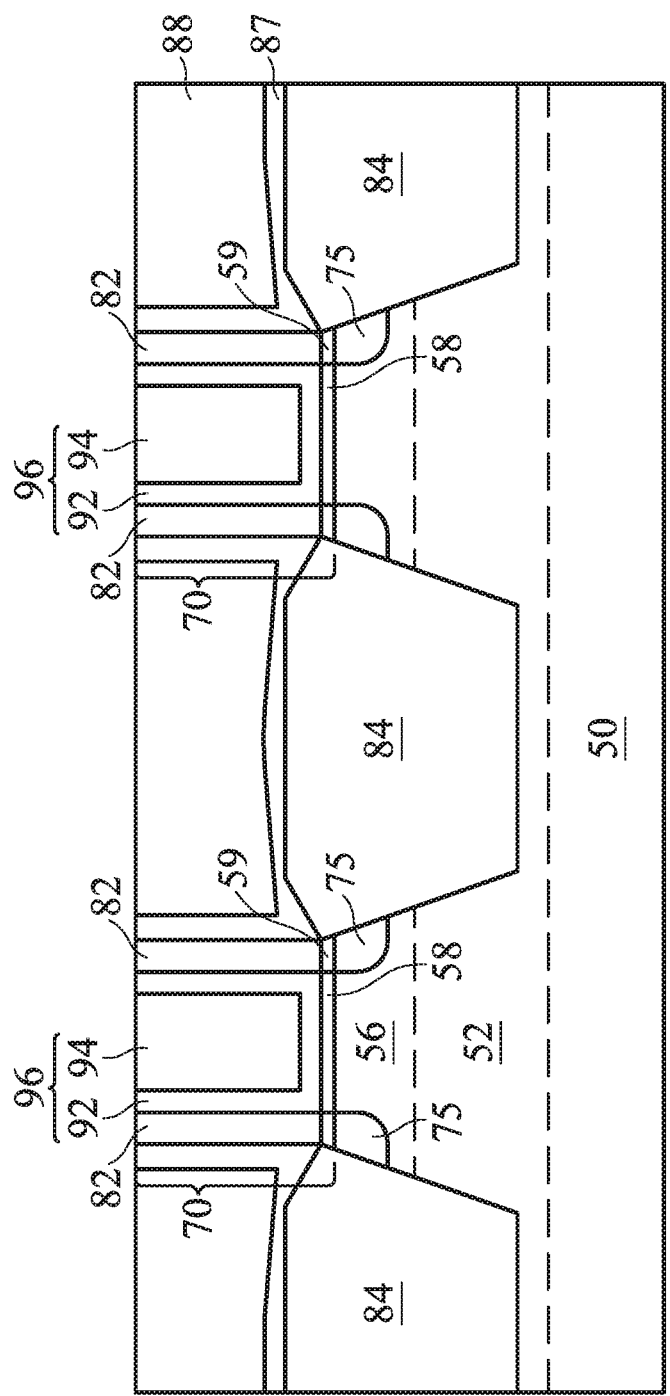
Figure 20C:
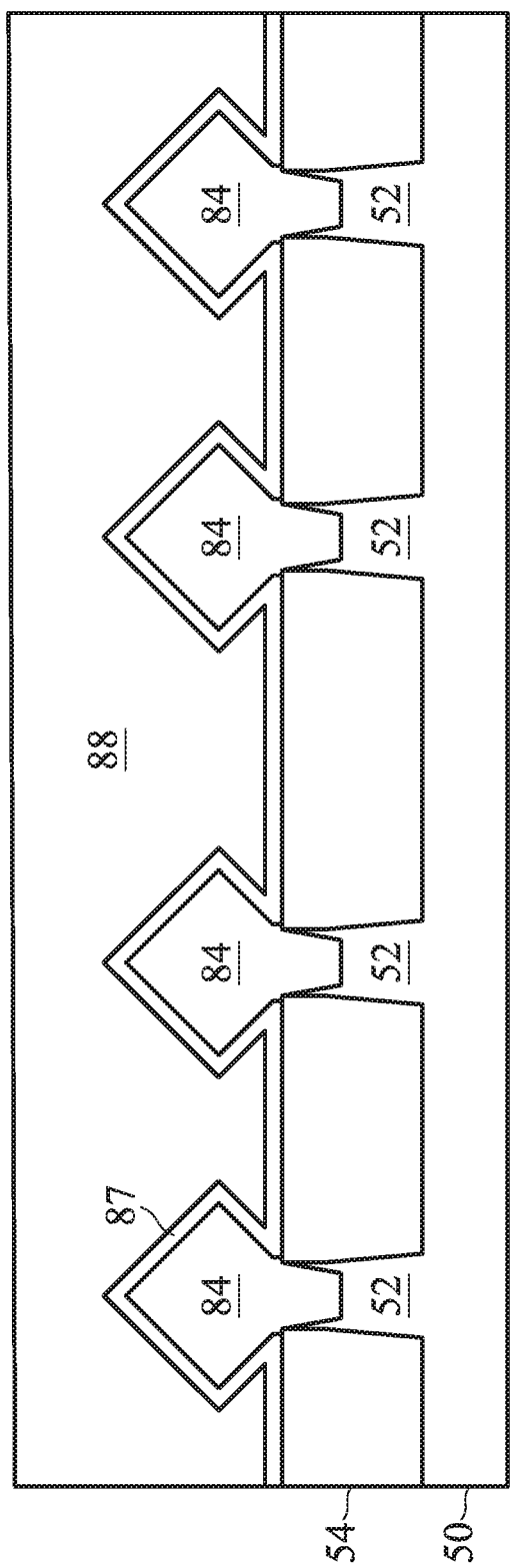

Referring to FIGS. 20A, 20B, and 20C, a gate dielectric layer 92 and a gate electrode layer 94 are formed in the recesses 90 (see FIGS. 19A, 19B, and 19C). In some embodiments, the gate dielectric layer 92 is conformally deposited in the recesses 90. In some embodiments, the gate dielectric layer 92 comprises silicon oxide, silicon nitride, or multilayers thereof. In other embodiments, the gate dielectric layer 92 includes a high-k dielectric material, and in these embodiments, the gate dielectric layer 92 may have a k value greater than about 7.0, and may include a metal oxide or a silicate of Hf, Al, Zr, La, Mg, Ba, Ti, Pb, and combinations thereof. The formation methods of the gate dielectric layer 92 may include Molecular-Beam Deposition (MBD), ALD, PECVD, a combination thereof, or the like. In some embodiments, the gate dielectric layer 92 may have a thickness between about 0.5 nm and about 4 nm.

Referring further to FIGS. 20A, 20B, and 20C, in some embodiments where the portions of the dielectric layer 58 are not removed over the channel regions of the fins 56, the portions of the dielectric layer 58 over the channel regions of the fins 56 may act as interfacial layers between the gate dielectric layer 92 and the channel regions of the fins 56. In some embodiments where the portions of the dielectric layer 58 are removed over the channel regions of the fins 56, interfacial layers may be formed over the channel regions of the fins 56 prior to forming the gate dielectric layer 92, and the gate dielectric layer 92 is formed over the interfacial layers. The interfacial layers help to buffer the subsequently formed high-k dielectric layer from the underlying semiconductor material. In some embodiments, the interfacial layers comprise a chemical silicon oxide, which may be formed of chemical reactions. For example, a chemical oxide may be formed using deionized water+ozone ($O_3$), $NH_4OH+H_2O_2+H_2O$ (APM), or other methods. Other embodiments may utilize a different material or processes (e.g., a thermal oxidation or a deposition process) for forming the interfacial layers. In some embodiments, the interfacial layers may have a thickness between about 0.5 nm and about 2 nm.

Next, the gate electrode layer 94 is deposited over the gate dielectric layer 92 and fills the remaining portions of the recesses 90 (see FIGS. 19A, 19B, and 19C). In some embodiments, the gate electrode layer 94 may comprise one or more layers of suitable conductive materials. The gate electrode layer 94 may comprise a metal selected from a group of W, Cu, Ti, Ag, Al, TiAl, TiAlN, TaC, TaCN, TaSiN, Mn, Co, Pd, Ni, Re, Ir, Ru, Pt, Zr, and combinations thereof. In some embodiments, the gate electrode layer 94 may comprise a metal selected from a group of TiN, WN, TaN, Ru, and combinations thereof. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. The gate electrode layer 94 may be formed using a suitable process such as ALD, CVD, PVD, plating, combinations thereof, or the like. In some embodiments, the gate electrode layer 94 may have a thickness between about 0.5 nm and about 6 nm. After filling the recesses 90 with the gate electrode layer 94, a planarization process, such as a CMP, may be performed to remove the excess portions of the gate dielectric layer 92 and the gate electrode layer 94, which excess portions are over the top surface of the ILD 88. The resulting remaining portions of materials of the gate electrode layer 94 and the gate dielectric layer 92 thus form replacement gates 96 of the resulting FinFET device. In other embodiments, the gates 70 may remain rather than being replaced by the replacement gates 96.

Figure 21A:
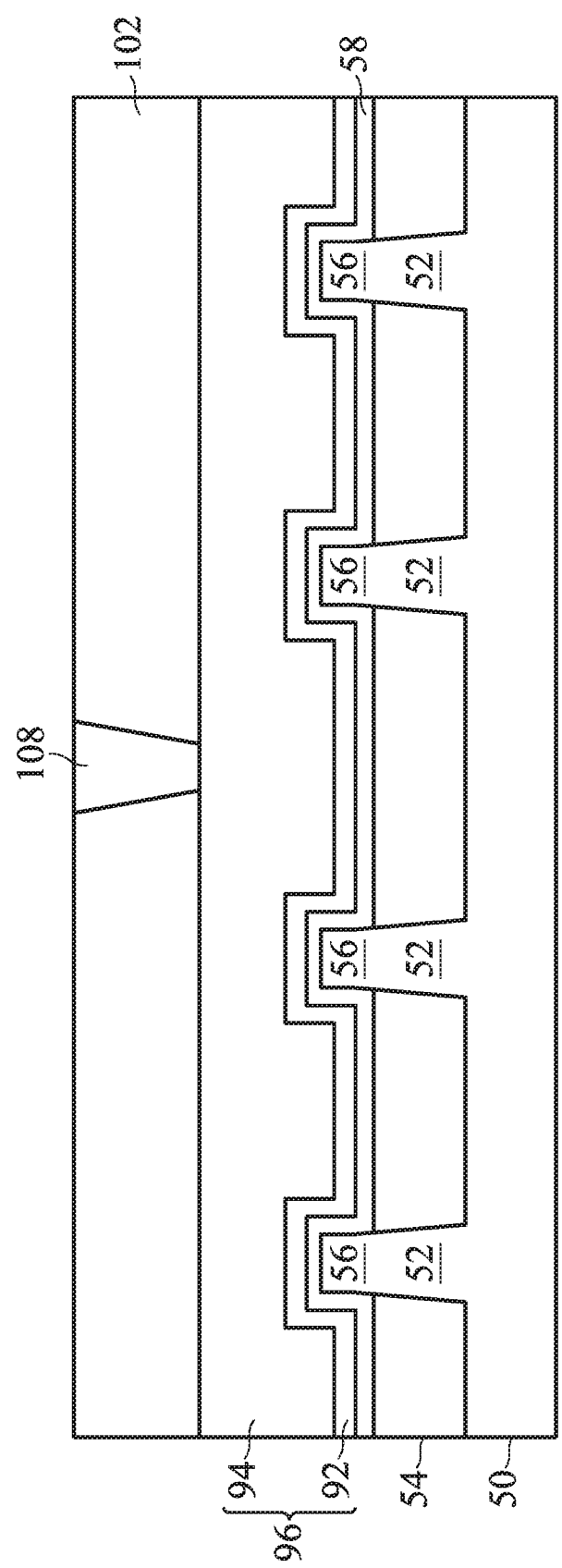
FIGS. 21A, 21B and 21C are cross-sectional views of a FinFET device in accordance with some embodiments.
Figure 21B:
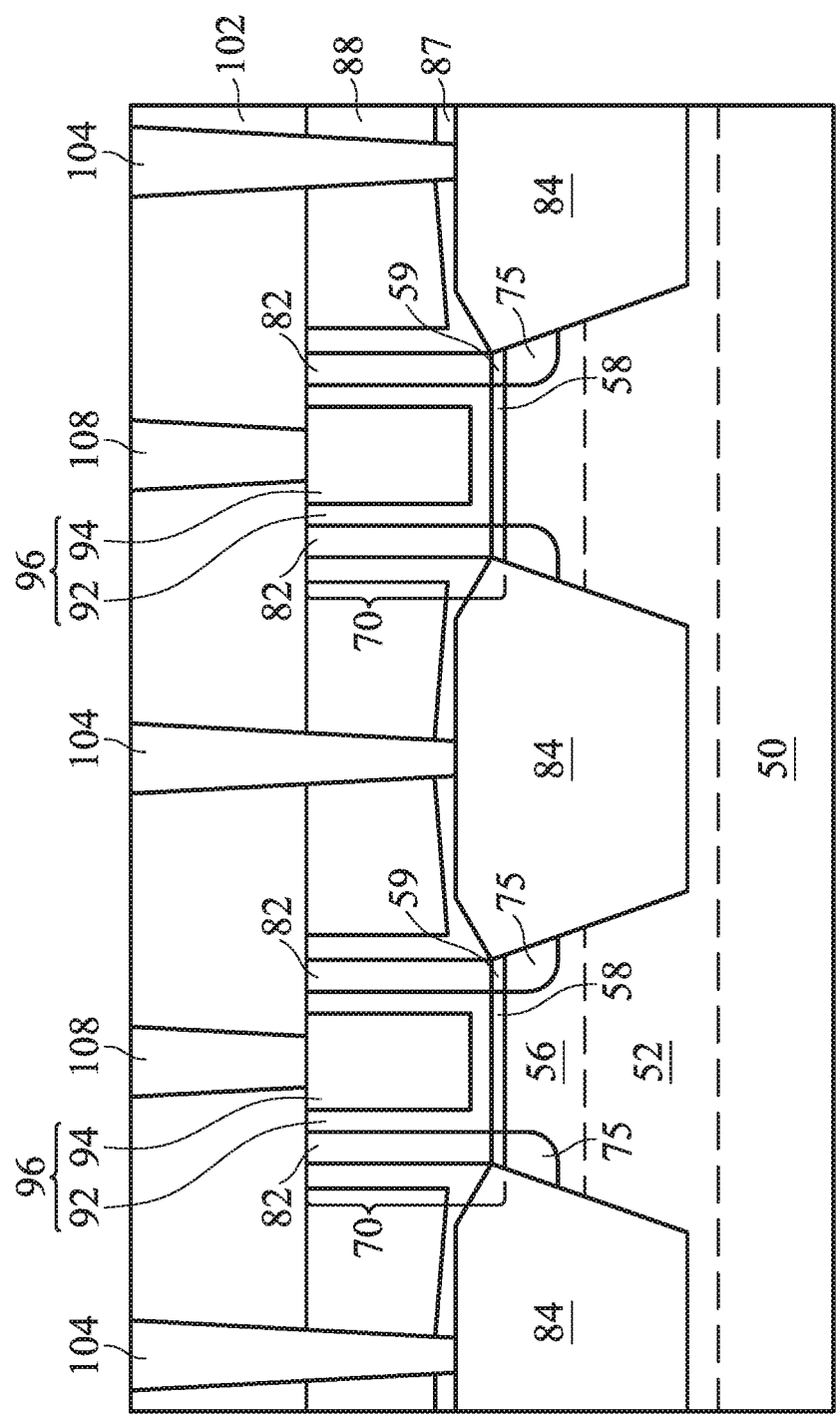
Figure 21C:
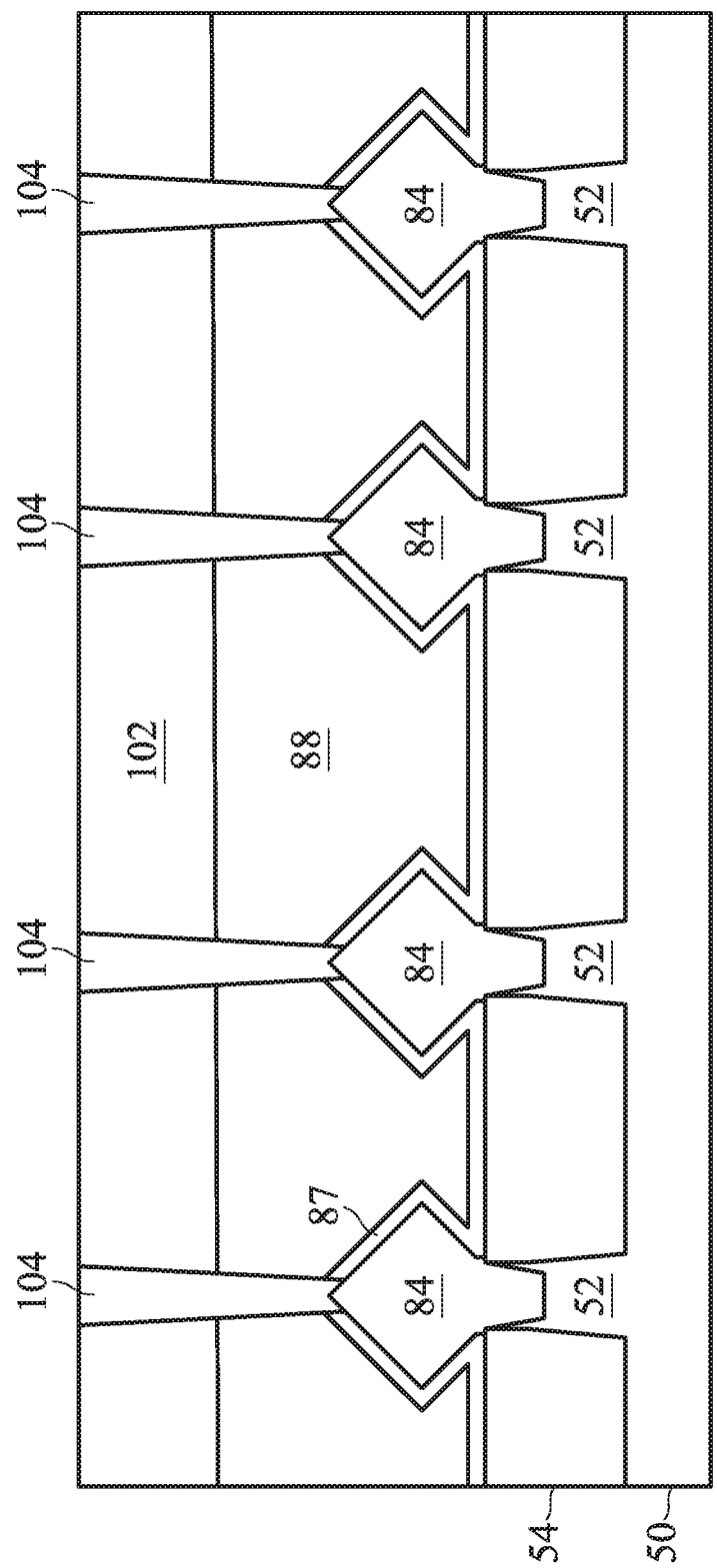

Referring to FIGS. 21A, 21B, and 21C, an ILD 102 is deposited over the ILD 88, contacts 104 are formed through the ILD 102 and the ILD 88, and contacts 108 are formed through the ILD 102. In an embodiment, the ILD 102 is formed using similar materials and methods as the ILD 88 described above with reference to FIGS. 18A, 18B, and 18C, and the description is not repeated herein for the sake of brevity. In some embodiments, the ILD 102 and the ILD 88 are formed of a same material. In other embodiments, the ILD 102 and the ILD 88 are formed of different materials.

Referring further to FIGS. 21A, 21B, and 21C, openings for the contacts 104 are formed through the ILDs 88 and 102, and the etch stop layer 87, and openings for the contacts 108 are formed through the ILD 102 and the etch stop layer 87. These openings may all be formed simultaneously in a same process, or in separate processes. The openings may be formed using acceptable photolithography and etching techniques. In some embodiments, a liner, such as a diffusion barrier layer, an adhesion layer, or the like, and a conductive material are formed in the openings. The liner may include titanium, titanium nitride, tantalum, tantalum nitride, a combination thereof, or the like. The conductive material may be copper, a copper alloy, silver, gold, tungsten, aluminum, nickel, a combination thereof, or the like. A planarization process, such as a CMP, may be performed to remove excess materials from a top surface of the ILD 102. The remaining liner and conductive material form the contacts 104 and 108. An anneal process may be performed to form silicides (not shown) at interfaces between the epitaxial source/drain regions 84 and the respective contacts 104. The contacts 104 are physically and electrically coupled to the epitaxial source/drain regions 84, and the contacts 108 are physically and electrically coupled to the replacement gates 96. While the contacts 104 are depicted in FIG. 21B in a same cross-section as the contacts 108, this depiction is for the purposes of illustration only and, in some embodiments, the contacts 104 may be disposed in a different cross-section from the contacts 108.

FIGS. 22A, 22B, and 22C illustrate cross-sectional views of a FinFET device that is similar to the FinFET device illustrated in FIGS. 21A, 21B, and 21C, with like elements labeled with like numerical references. In some embodiments, the FinFET device of FIGS. 22A, 22B, and 22C may be formed using similar materials and methods and FinFET device of FIGS. 21A, 21B, and 21C, described above with reference to FIGS. 2A-21C, and the description is not repeated herein for the sake of brevity. In the illustrated embodiment, adjacent epitaxial source/drain regions 84 are merged to form a common epitaxial source/drain region 84. In some embodiments, voids (not shown) may be formed below the common epitaxial source/drain region 84, and between the common epitaxial source/drain region 84 and the isolation regions 54. In some embodiments, the voids are filled with the material of the ILD 88. In the illustrated embodiment, the common epitaxial source/drain region 84 has a planar top surface. In other embodiments, the common epitaxial source/drain region 84 may have a non-planar top surface.

Figure 23:
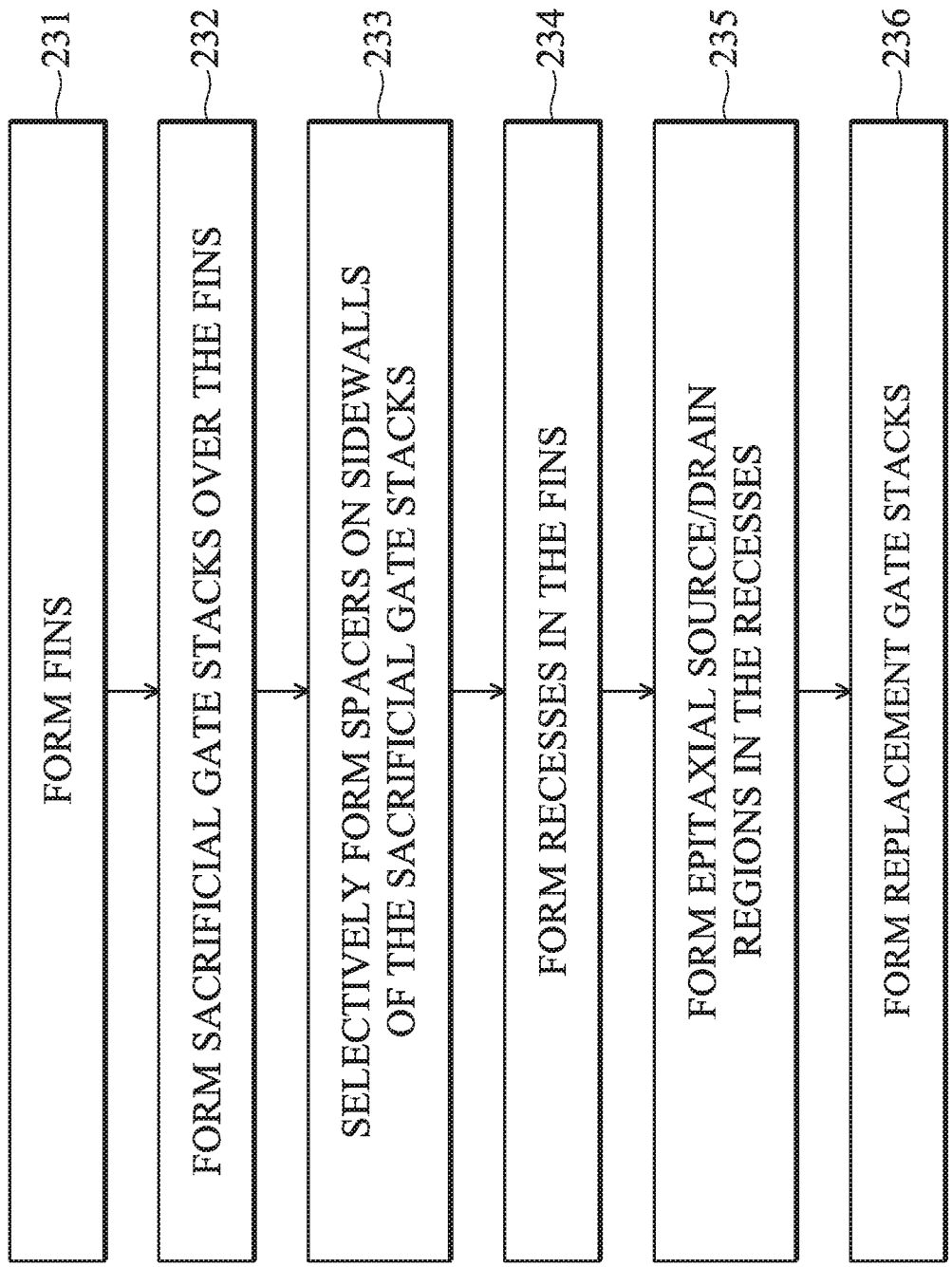
FIG. 23 is a flow diagram illustrating a method of forming a FinFET device in accordance with some embodiments.

FIG. 23 is a flow diagram illustrating a method 230 of forming a FinFET device in accordance with some embodiments. The method 230 starts with step 231, where a substrate (such as the substrate 50 illustrated in FIG. 2A) is patterned to form fins (such as the fins 56 illustrated in FIG. 5A) as described above with reference to FIGS. 2A-5A. In step 232, sacrificial gate stacks (such as the gates 70 illustrated in FIGS. 7A and 7B) are formed over the fins as described above with reference to FIGS. 6A, 6B, and 7A-7C. In step 233, spacers (such as the spacers 82 illustrated in FIG. 11B or FIG. 15B) are selectively formed on sidewalls of the sacrificial gate stacks as described above with reference to FIGS. 8A-11C or FIGS. 12A-15C. In step 234, the fins are patterned using the sacrificial gate stacks and the spacers as a combined mask to form recesses (such as the recesses 76 illustrated in FIGS. 16B and 16C) in the fins as described above with reference to FIGS. 16A-16C. In step 235, source/drain regions (such as the epitaxial source/drain regions 84 illustrated in FIGS. 17B and 17C) are epitaxially grown in the recesses as described above with reference to FIGS. 17A-17C. In step 236, replacement gate stacks (such as the replacement gates 96 illustrated in FIGS. 20A and 20B) are formed over the fins as described above with reference to FIGS. 18A-20C.

Various embodiments discussed herein allow for selectively forming gate spacers on sidewalls of gates, forming well-defined nucleation areas for epitaxial source/drain regions, forming uniform epitaxial source/drain regions, enlarging process window, precise process control, and easy process integration.

According to an embodiment, a method includes: forming a fin extending above an isolation region; forming a sacrificial gate over the fin; selectively depositing a first dielectric material on sidewalls of the sacrificial gate to form spacers on the sidewalls of the sacrificial gate, where the first dielectric material is not deposited over a top surface of the sacrificial gate; patterning the fin using the sacrificial gate and the spacers as a combined mask to form a recess in the fin; and forming an epitaxial source/drain region in the recess. In an embodiment, forming the sacrificial gate over the fin includes: forming a gate electrode layer over the fin; forming a patterned mask over the gate electrode layer; and transferring a pattern of the patterned mask to the gate electrode layer. In an embodiment, the method further includes, before selectively depositing the first dielectric material on the sidewalls of the sacrificial gate, performing a fluorination process on the patterned mask. In an embodiment, the method further includes, before performing the fluorination process on the patterned mask, forming a second dielectric material on sidewalls and a top surface the patterned mask. In an embodiment, the method further includes, after performing the fluorination process on the patterned mask, removing the second dielectric material. In an embodiment, forming the second dielectric material on the sidewalls and the top surface of the patterned mask further includes forming the second dielectric material on the sidewalls of the sacrificial gate. In an embodiment, forming the second dielectric material on the sidewalls and the top surface of the patterned mask includes selectively depositing the second dielectric material on the sidewalls and the top surface of the patterned mask.

According to another embodiment, a method includes: recessing an isolation region to expose sidewalls of a semiconductor fin; forming a gate electrode layer over the semiconductor fin; forming a patterned mask over the gate electrode layer; removing portions of the gate electrode layer exposed by the patterned mask to form a sacrificial gate over the semiconductor fin; performing a fluorination process on the patterned mask to form a fluorinated patterned mask; selectively depositing a first dielectric material on sidewalls of the sacrificial gate to form spacers on the sidewalls of the sacrificial gate; etching the semiconductor fin using the fluorinated patterned mask, the sacrificial gate and the spacers as a combined mask to form a recess in the semiconductor fin; and depositing a semiconductor material in the recess. In an embodiment, the method further includes, before performing the fluorination process on the patterned mask, forming a second dielectric material on sidewalls and a top surface of the patterned mask. In an embodiment, the second dielectric material includes aluminum oxide. In an embodiment, the method further includes, before forming the gate electrode layer over the semiconductor fin, forming a third dielectric material over the semiconductor fin. In an embodiment, the method further includes: after forming the sacrificial gate over the semiconductor fin, forming the second dielectric material over exposed portions of the third dielectric material; and performing the fluorination process on the exposed portions of the third dielectric material. In an embodiment, the patterned mask includes an oxide material. In an embodiment, performing the fluorination process comprises performing a plasma process using a mixture of process gasses including $NF_3$.

According to yet another embodiment, a method includes: etching an isolation region to expose sidewalls of a semiconductor fin; forming a first oxide material on the sidewalls and a top surface of the semiconductor fin; forming a conductive material over the first oxide material; forming a second oxide material over the conductive material; etching the second oxide material to form a patterned second oxide material; etching the conductive material using the patterned second oxide material as a mask to form a sacrificial gate over the semiconductor fin; forming a first dielectric material on sidewalls and a top surface of the patterned second oxide material, and over exposed portions of the first oxide material; performing a fluorination process on the patterned second oxide material and the exposed portions of the first oxide material, the fluorination process forming a fluorinated patterned second oxide material; removing the first dielectric material; selectively depositing a second dielectric material on sidewalls of the sacrificial gate; etching the semiconductor fin using the fluorinated patterned second oxide material, the sacrificial gate and the second dielectric material as a combined mask to form a recess in the semiconductor fin; and epitaxially growing a semiconductor material in the recess. In an embodiment, the method further includes, before performing the fluorination process, forming the first dielectric material on the sidewalls of the sacrificial gate. In an embodiment, the method further includes replacing the sacrificial gate with a replacement gate. In an embodiment, performing the fluorination process includes performing a plasma process using a mixture of process gasses including $NF_3$ and $NH_3$. In an embodiment, removing the first dielectric material includes etching the first dielectric material. In an embodiment, the fluorination process does not substantially etch the first dielectric material.

According to yet another embodiment, a method includes: forming a sacrificial gate over an active region of a substrate; forming a mask over the sacrificial gate; depositing a first dielectric layer along sidewalls and a top surface of the mask; performing a fluorination process on the mask through the first dielectric layer to form a fluorinated mask; after performing the fluorination process, removing the first dielectric layer from the fluorinated mask; after removing the first dielectric layer, depositing a second dielectric layer on sidewalls of the sacrificial gate to form spacers on the sidewalls of the sacrificial gate, where a topmost surface of the second dielectric layer is below a bottommost surface of the fluorinated mask during depositing the second dielectric layer; patterning the active region of the substrate using the fluorinated mask, the sacrificial gate and the spacers as a combined mask to form a recess in the active region of the substrate; and forming an epitaxial source/drain region in the recess.

According to yet another embodiment, a method includes: depositing a gate electrode layer over an active region of a substrate; forming a patterned mask over the gate electrode layer; etching portions of the gate electrode layer exposed by the patterned mask to form a sacrificial gate over the active region of the substrate; performing a fluorination process on the patterned mask to form a fluorinated patterned mask, the fluorination process inhibiting a growth of a first dielectric material on sidewalls and a top surface of the patterned fluorinated mask; after performing the fluorination process and while the patterned fluorinated mask is on the sacrificial gate, depositing the first dielectric material on sidewalls of the sacrificial gate to form spacers on the sidewalls of the sacrificial gate; etching the active region of the substrate using the fluorinated patterned mask, the sacrificial gate and the spacers as a combined mask to form a recess in the active region of the substrate; and depositing a semiconductor material in the recess.

According to yet another embodiment, a method includes: depositing a first oxide material over an active region of a substrate; depositing a conductive material over the first oxide material; depositing a second oxide material over the conductive material; etching the second oxide material to form a patterned second oxide material; etching the conductive material using the patterned second oxide material as a mask to form a sacrificial gate over the active region of the substrate; depositing a first dielectric material on sidewalls and a top surface of the patterned second oxide material, and over exposed portions of the first oxide material; performing a fluorination process on the patterned second oxide material and the exposed portions of the first oxide material through the first dielectric material, the fluorination process forming a fluorinated patterned second oxide material; after performing the fluorination process, selectively etching the first dielectric material; selectively depositing a second dielectric material on sidewalls of the sacrificial gate; etching the active region of the substrate using the fluorinated patterned second oxide material, the sacrificial gate and the second dielectric material as a combined mask to form a recess in the active region of the substrate; and epitaxially growing a semiconductor material in the recess.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a gate electrode layer over an active region of a substrate;
forming a patterned mask over the gate electrode layer;
etching portions of the gate electrode layer exposed by the patterned mask to form a sacrificial gate over the active region of the substrate;
performing a fluorination process on the patterned mask to form a fluorinated patterned mask, the fluorination process inhibiting a growth of a first dielectric material on sidewalls and a top surface of the patterned fluorinated mask;
after performing the fluorination process and while the patterned fluorinated mask is on the sacrificial gate, depositing the first dielectric material on sidewalls of the sacrificial gate to form spacers on the sidewalls of the sacrificial gate;
etching the active region of the substrate using the fluorinated patterned mask, the sacrificial gate and the spacers as a combined mask to form a recess in the active region of the substrate; and
depositing a semiconductor material in the recess.

2. The method of claim 1, further comprising, before performing the fluorination process on the patterned mask, forming a second dielectric material on the sidewalls and the top surface of the patterned mask.

3. The method of claim 2, wherein the second dielectric material is an oxide.

4. The method of claim 2, wherein the second dielectric material is not substantially etched during the fluorination process.

5. The method of claim 1, wherein no etching process is performed on the first dielectric material after depositing the first dielectric material and before etching the active region of the substrate.

6. The method of claim 1, wherein the first dielectric material is a nitride.

7. The method of claim 1, wherein performing the fluorination process comprises performing a plasma process using a mixture of process gasses comprising $NF_3$.

8. A method comprising:
depositing a first oxide material over an active region of a substrate;
depositing a conductive material over the first oxide material;
depositing a second oxide material over the conductive material;
etching the second oxide material to form a patterned second oxide material;
etching the conductive material using the patterned second oxide material as a mask to form a sacrificial gate over the active region of the substrate;
depositing a first dielectric material on sidewalls and a top surface of the patterned second oxide material, and over exposed portions of the first oxide material;
performing a fluorination process on the patterned second oxide material and the exposed portions of the first oxide material through the first dielectric material, the fluorination process forming a fluorinated patterned second oxide material;
after performing the fluorination process, selectively etching the first dielectric material;
selectively depositing a second dielectric material on sidewalls of the sacrificial gate;
etching the active region of the substrate using the fluorinated patterned second oxide material, the sacrificial gate and the second dielectric material as a combined mask to form a recess in the active region of the substrate; and
epitaxially growing a semiconductor material in the recess.

9. The method of claim 8, wherein the fluorination process inhibits a growth of the second dielectric material on sidewalls and a top surface of the fluorinated patterned second oxide material.

10. The method of claim 8, wherein selectively etching the first dielectric material comprises performing a dry etching process with a mixture of $Cl_2$ and $SiCl_4$, a mixture of $Cl_2$ and $BCl_3$, or a mixture of $Cl_2$ and HBr.

11. The method of claim 8, wherein depositing the first dielectric material further comprises depositing the first dielectric material on the sidewalls of the sacrificial gate.

12. The method of claim 8, wherein performing the fluorination process comprises performing a plasma process using a mixture of process gasses comprising $NF_3$ and $NH_3$.

13. The method of claim 8, wherein the fluorination process does not substantially etch the first dielectric material.

14. A method comprising:
    forming a first layer over an active region of a substrate;
    forming a second layer over the first layer;
    performing a fluorination process on the second layer to form a fluorinated second layer; and
    after performing the fluorination process, depositing a third layer on sidewalls of the first layer, wherein a topmost surface of the third layer is below a bottommost surface of the fluorinated second layer during depositing the third layer.

15. The method of claim 14, wherein performing the fluorination process comprises performing a plasma process using a mixture of process gasses comprising $NF_3$.

16. The method of claim 14, wherein an atomic fraction of fluorine in the fluorinated second layer is between about 0.03 and about 0.05.

17. The method of claim 14, further comprising:
    patterning the active region of the substrate using the first layer, the fluorinated second layer and the third layer as a combined mask to form a recess in the active region of the substrate; and
    forming an epitaxial source/drain region in the recess.

18. The method of claim 14, wherein the second layer comprises an oxide.

19. The method of claim 14, wherein the third layer comprises a nitride.

20. The method of claim 14, wherein a growth of a material of the third layer is inhibited on sidewalls and a top surface of the fluorinated second layer.

* * * * *